US011418695B2

(12) United States Patent
Miu et al.

(10) Patent No.: US 11,418,695 B2
(45) Date of Patent: Aug. 16, 2022

(54) DIGITAL IMAGING SYSTEM INCLUDING PLENOPTIC OPTICAL DEVICE AND IMAGE DATA PROCESSING METHOD FOR VEHICLE OBSTACLE AND GESTURE DETECTION

(71) Applicant: Magna Closures Inc., Newmarket (CA)

(72) Inventors: Traian Miu, Oakville (CA); Gabriele Wayne Sabatini, Keswick (CA)

(73) Assignee: MAGNA CLOSURES INC., Newmarket (CA)

( * ) Notice: Subject to any disclaimer, the term of this patent is extended or adjusted under 35 U.S.C. 154(b) by 301 days.

(21) Appl. No.: 16/710,664

(22) Filed: Dec. 11, 2019

(65) Prior Publication Data
US 2020/0195837 A1    Jun. 18, 2020

Related U.S. Application Data

(60) Provisional application No. 62/875,114, filed on Jul. 17, 2019, provisional application No. 62/778,566, filed on Dec. 12, 2018.

(51) Int. Cl.
*H04N 5/232* (2006.01)
*H01L 27/146* (2006.01)
(Continued)

(52) U.S. Cl.
CPC ........... *H04N 5/23212* (2013.01); *B60R 1/00* (2013.01); *G02B 3/0037* (2013.01); *G06V 20/58* (2022.01);
(Continued)

(58) Field of Classification Search
CPC ............. H04N 5/23212; H04N 5/2254; H04N 5/23238; H04N 5/23232; H04N 5/22541;
(Continued)

(56) References Cited

U.S. PATENT DOCUMENTS 9,654,683 B2    5/2017  Xu et al.
9,809,168 B2 *  11/2017 Taylor ................... G01S 13/862
(Continued)

FOREIGN PATENT DOCUMENTS

CN          104680532    * 12/2017
EP         3104593 A1    12/2016

*Primary Examiner* — Shahbaz Nazrul
(74) *Attorney, Agent, or Firm* — Dickinson Wright PLLC

(57) ABSTRACT

A digital imaging system and method of image data processing are provided. The system includes a main lens configured to focus light from a field of view for a plurality of depths of field and project a plurality of intermediary images representing the depths of field. An image sensor assembly is in a spaced relationship with the main lens and includes a light sensors grouped into sensor sub-arrays. An intermediate microlens array is disposed between the main lens and the image sensor assembly and includes intermediate micro lenses adjacent to and abutting one another to focus the intermediary images onto one of the sensor sub-arrays from a different perspective than another adjacent micro lens. A control unit captures and stores image data associated with the intermediary images and creates a three-dimensional depth map. The control unit also calculates distance information of objects to detect a gesture or obstacle.

19 Claims, 27 Drawing Sheets

(51) Int. Cl.
 *B60R 1/00* (2022.01)
 *G02B 3/00* (2006.01)
 *G06V 20/58* (2022.01)
 *H04N 5/225* (2006.01)

(52) U.S. Cl.
 CPC ...... *H01L 27/14627* (2013.01); *H04N 5/2254* (2013.01); *H04N 5/23238* (2013.01)

(58) Field of Classification Search
 CPC .. H04N 5/232125; B60R 1/00; G02B 3/0037; G02B 3/0056; G02B 27/0075; G06V 20/58; G06V 10/147; G06V 40/28; G06V 10/25; H01L 27/14627; G06K 9/6267
 See application file for complete search history.

(56) References Cited

U.S. PATENT DOCUMENTS

| | | |
|---|---|---|
| 2003/0020971 A1 | 1/2003 | Kwon |
| 2015/0264335 A1 | 9/2015 | Park |
| 2016/0314362 A1 | 10/2016 | Elie et al. |
| 2017/0197615 A1* | 7/2017 | Elie ................ B60W 30/06 |
| 2018/0067237 A1* | 3/2018 | Vandame ............ G02B 3/0056 |
| 2018/0072320 A1 | 3/2018 | Fattal |
| 2019/0028966 A1* | 1/2019 | Lau ................ H04W 52/0216 |
| 2019/0337453 A1 | 11/2019 | Lynam |
| 2019/0391592 A1* | 12/2019 | Ten Houten ......... G05D 1/0088 |
| 2020/0142422 A1* | 5/2020 | Valois ................ G06V 20/58 |
| 2020/0290513 A1* | 9/2020 | Karafin ................ G06F 3/013 |
| 2021/0021758 A1* | 1/2021 | Le Scouarnec ...... H04N 13/232 |
| 2021/0291859 A1* | 9/2021 | Kido ................ B60W 50/0097 |

\* cited by examiner

DIGITAL IMAGING SYSTEM INCLUDING PLENOPTIC OPTICAL DEVICE AND IMAGE DATA PROCESSING METHOD FOR VEHICLE OBSTACLE AND GESTURE DETECTION

CROSS-REFERENCE TO RELATED APPLICATIONS

This application claims the benefit of previously filed U.S. Provisional Patent Application No. 62/778,566, filed Dec. 12, 2018, and further claims the benefit of previously filed U.S. Provisional Patent Application No. 62/875,114, filed Jul. 17, 2019, the content of each of which are hereby incorporated by reference in its entirety.

FIELD

The present disclosure relates generally to an imaging system and method, more particularly to a digital imaging system including a plenoptic lens system and method of image data processing for detecting at least one of a gesture and an obstacle.

BACKGROUND

This section provides background information related to the present disclosure which is not necessarily prior art.

Motor vehicles are increasingly being equipped with sensors that detect the environment surrounding the motor vehicle. For example, some vehicles include imaging systems that provide images of the obstacles and/or other objects in the vicinity of the vehicle, while the vehicle is stationary. Imaging systems have also been used to detect the presence and position of objects near the motor vehicle while the vehicle is moving. The signals and data generated by imaging systems can be used by other systems of the motor vehicle to provide gesture recognition for vehicle entry and safety features such as collision avoidance, and parking assistance. The data from the imaging systems may also be used to intervene in controlling the vehicle.

Such imaging system may utilize a main lens that has a fixed focal length for focusing on objects a set distance from the vehicle and used in conjunction with a sensor assembly for capturing corresponding imaging. Nevertheless, as such imaging systems only have a fixed focal length, objects closer to the vehicle may remain out of focus or lose detail. Accordingly, there remains a need for improved imaging systems and methods of operation thereof that overcome these shortcomings.

SUMMARY

This section provides a general summary of the present disclosure and is not a comprehensive disclosure of its full scope or all of its features and advantages.

It is an object of the present disclosure to provide a digital imaging system and method of image data processing that addresses and overcomes the above-noted shortcomings.

Accordingly, it is an aspect of the present disclosure to provide a digital imaging system for detecting at least one of a gesture and an obstacle. The digital imaging system includes a plenoptic lens system including a main lens configured to focus light from a field of view for a plurality of depths of field and project a plurality of intermediary images each representing one of the plurality of depths of field. The digital imaging system also includes an image sensor assembly disposed in a spaced relationship with the main lens and including a plurality of light sensors. In addition, the plenoptic lens system includes an intermediate microlens array disposed between the main lens and the image sensor assembly in a spaced relationship with each of the main lens and the image sensor assembly and including a plurality of intermediate micro lenses adjacent to one another. The intermediate microlens array focuses the plurality of intermediary images from the main lens onto the image sensor assembly. Each of the plurality of intermediate micro lenses projects the plurality of intermediary images onto the image sensor assembly from a different perspective than another of the plurality of micro lenses that is adjacent thereto. The digital imaging system also includes a memory unit for storing image data associated with the plurality of intermediary images. Furthermore, the digital imaging system includes a control unit coupled to the image sensor assembly and the memory unit and configured to capture the image data associated with the plurality of intermediary images using the image sensor assembly. The control unit is also configured to store the image data associated with the plurality of intermediary images using the memory unit and create a three-dimensional depth map using the image data representing the plurality of intermediary images. The control unit also calculates distance information of objects in the field of view and detects the at least one of a gesture and the obstacle based on the three-dimensional depth map and distance information.

According to another aspect, there is provided a digital imaging system for detecting at least one of a gesture and an obstacle, including a plenoptic lens system including a main lens configured to focus light from a field of view for a plurality of depths of field and project a plurality of intermediary images each representing one of the plurality of depths of field, an image sensor assembly disposed in a spaced relationship with the main lens and including a plurality of light sensors configured to output image data, and the plenoptic lens system including an intermediate microlens array disposed between the main lens and the image sensor assembly in a spaced relationship with the main lens and the image sensor assembly and including a plurality of intermediate micro lenses adjacent to one another for focusing the plurality of intermediary images from the main lens onto the image sensor assembly, wherein each of the plurality of intermediate micro lenses projects the plurality of intermediary images onto the image sensor assembly from a different perspective than another of the plurality of intermediate micro lenses being adjacent thereto, and a control unit coupled to the image sensor assembly and configured to calculate distance information of a plurality of surfaces of an object in at least one of the plurality of depths of field using the image data, and detect the at least one of a gesture and the obstacle based on the distance information.

According to another aspect, there is provided a digital imaging system for detecting a distance of an object, including a plenoptic lens system including a main lens configured to focus light from a field of view for a plurality of depths of field and project a plurality of intermediary images each representing one of the plurality of depths of field, an image sensor assembly disposed in a spaced relationship with the main lens and including a plurality of light sensors configured to output image data, and the plenoptic lens system including an intermediate microlens array disposed between the main lens and the image sensor assembly in a spaced relationship with the main lens and the image sensor assembly and including a plurality of intermediate micro lenses adjacent to one another for focusing the plurality of intermediary images from the main lens onto the image sensor assembly, wherein each of the plurality of intermediate micro lenses projects the plurality of intermediary images onto the image sensor assembly from a different perspective than another of the plurality of intermediate micro lenses being adjacent thereto, and a control unit coupled to the image sensor assembly and configured to calculate distance information of a plurality of surfaces of an object in at least one of the plurality of depths of field using the image data. The system may be configured to provide a vehicle system with the distance information.

In one aspect, the main lens is configured to focus light from a field of view for a plurality of depths of field and project the plurality of intermediary images each representing one of the plurality of depths of field, wherein the plurality of light sensors are grouped into a plurality of sensor sub-arrays, and wherein the plurality of intermediate micro lenses are grouped into a plurality of microlens sections each for focusing one of the plurality of intermediary images from the main lens onto one of the plurality of sensor sub-arrays.

In one aspect, the main lens comprises a plurality of main micro lenses adjacent to and abutting one another to simultaneously focus light from the plurality of depths of field and project the plurality of intermediary images, wherein the plurality of intermediary images are representative of a plurality of portions of the field of view at the plurality of depths of field.

In one aspect, the main lens is disposed a first distance from the intermediate microlens array and the first distance is greater than a main focal length of each of the plurality of main micro lenses.

In one aspect, the intermediate microlens array is disposed a second distance from the image sensor assembly and the second distance is equal to an intermediate focal length of each of the plurality of intermediate micro lenses.

In one aspect, the plurality of main micro lenses have a plurality of main focal lengths selected to project the plurality of intermediary images with the plurality of depths of field being equally spaced from one another.

In one aspect, the plurality of main micro lenses have a plurality of main focal lengths selected to project the plurality of intermediary images with the plurality of depths of field being selected as a function of the distance from the main lens.

In one aspect, the plurality of depths of field are configured to be smaller as distance from the main lens increases.

In one aspect, the plurality of depths of field are configured to be larger as distance from the main lens increases.

In one aspect, the main lens comprises a birefringent lens including at least one layer of liquid crystals being movable by an applied current to individually focus light from the plurality of depths of field and project the plurality of intermediary images sequentially, wherein the plurality of intermediary images are representative of the field of view at each of the plurality of depths of field.

In one aspect, the control unit is configured to supply the applied current to the at least one layer of liquid crystals to individually focus light from each of the plurality of depths of field and project the plurality of intermediary images in sequence over a predetermined period of time.

In one aspect, the control unit is further configured to provide position and distance information of at least one object to a vehicle system.

According to another aspect of the disclosure, a method for detecting at least one of a gesture and an obstacle using a digital imaging system is provided. The digital imaging system used in the method includes a main lens and an image sensor assembly disposed in a spaced relationship with the main lens and an intermediate microlens array disposed between the main lens and the image sensor assembly in a spaced relationship with each of the main lens and the image sensor. The method begins with the step of focusing light from a field of view for a plurality of depths of field and projecting a plurality of intermediary images representative of a plurality of portions of the field of view at the plurality of depths of field using the main lens. The method continues with the step of focusing the plurality of intermediary images from the main lens onto the image sensor assembly using the intermediate microlens array. The next step of the method is capturing image data associated with the plurality of intermediary images representative of a plurality of portions of the field of view at a plurality of depths of field using the image sensor assembly. The method proceeds by storing the image data representing the plurality of intermediary images using a memory unit. The method also includes the step of creating a three-dimensional depth map using the image data associated with the plurality of intermediary images. Next, calculating distance information of each of the plurality of portions of the field of view. The method concludes with the step of detecting the at least one of a gesture and the obstacle based on the three-dimensional depth map and distance information.

In one aspect, the method includes the step of occluding background image information.

In one aspect, the method includes the step of identifying and classifying areas of interest for each of the plurality of intermediary images.

In one aspect, the step of creating a three-dimensional depth map using the image data associated with the plurality of intermediary images includes the steps of: creating the three-dimensional depth map using the image data associated with the plurality of intermediary images for the areas of interest; and ignoring the image data not associated with the areas of interest.

In one aspect, the method includes the step of providing position and distance 54 information of at least one object in the areas of interest to a vehicle system.

In one aspect, the vehicle system includes at least one of a vehicle detection and ranging system and a gesture recognition system and a biometric identification system and a vehicle detection system.

In one aspect, the method includes enhancing the plurality of intermediary images via image processing including at least one of low light compensation and edge enhancement and resolution enhancement.

In one aspect, the step of focusing light from the field of view for the plurality of depths of field and projecting the plurality of intermediary images representative of the plurality of portions of the field of view at the plurality of depths of field using the main lens includes the step of supplying an applied current to at least one layer of liquid crystals of a birefringent lens to individually focus light from each of the plurality of depths of field and project the plurality of intermediary images in sequence over a predetermined period of time.

In one aspect, the step of focusing light from the field of view for the plurality of depths of field and projecting the plurality of intermediary images representative of the plurality of portions of the field of view at the plurality of depths of field using the main lens includes the step of simultaneously focusing light from the plurality of depths of field and projecting the plurality of intermediary images.

According to yet another aspect of the disclosure, there is provided a method for detecting an object using a plenoptic camera including an image sensor assembly outputting image data including depth data of the object within a field of view, the method including the steps of calculating at least one of position and distance information of the object within the field of view using the image data, and providing the at least one of position and distance information of the object in the field of view to a vehicle system.

According to yet another aspect of the disclosure, an optical device for detecting at least one of a gesture and an obstacle is provided. The optical device includes a plenoptic lens system including a main lens configured to focus light from a field of view for a plurality of depths of field and project a plurality of intermediary images each representing one of depths of field. The optical device also includes an image sensor assembly disposed in a spaced relationship with the main lens and including a plurality of light sensors. The plenoptic lens system additionally includes an intermediate microlens array disposed between the main lens and the image sensor in a spaced relationship with each of the main lens and the image sensor assembly and includes a plurality of intermediate micro lenses adjacent to one another for focusing the plurality of intermediary images from the main lens onto the image sensor assembly. Each of the plurality of intermediate micro lenses projects the plurality of intermediary images onto the image sensor assembly from a different perspective than another of the plurality of intermediate micro lenses being adjacent thereto.

In one aspect, the main lens comprises a plurality of main micro lenses adjacent to another to simultaneously focus light from the plurality of depths of field and project the plurality of intermediary images onto a plurality of associated intermediate micro lenses, wherein each of the plurality of intermediary images are representative of a portion of the field of view at one of the plurality of depths of field.

In one aspect, the main lens comprises a birefringent lens comprising a variable focal length and configured to individually focus light from the plurality of depths of field and project the plurality of intermediary images, wherein the variable focal length is varied in sequence to render each of the plurality of intermediary images representative of the field of view at each of the plurality of depths of field in focus.

In accordance with another aspect, there is provided a vehicular vision system for a motor vehicle, the vehicular vision system including a plenoptic camera having a field of view for a plurality of depths of field of an exterior of the motor vehicle and configured to output image data comprising depth information for each of the plurality of depths of field, a display device comprising a three dimensional video display disposed in an interior cabin of the motor vehicle and viewable by an occupant of the vehicle and configured to display on a video display screen exterior video images derived from image data, where the display device provides to the occupant a different view of the exterior video images as the occupant changes a viewing angle of the display device to provide the occupant a depth perception of the exterior of the motor vehicle.

In accordance with another aspect, there is provided a method of providing an occupant of a vehicle depth perception of an object exterior to a motor vehicle captured, the method including the steps of providing a plenoptic camera configured to capture of light field of the exterior of the motor vehicle, providing a three dimensional display disposed in an interior cabin of the motor vehicle configured to display the light field as video images and viewable by the occupant of the vehicle, and configuring the three dimensional display to provide to the occupant a different view of video images as the occupant changes a viewing angle of the display device to provide the occupant a depth perception of the exterior of the motor vehicle.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 2A shows a partially expanded side view of a stage 2A of imaging system of FIG. 2;

Figure 19:
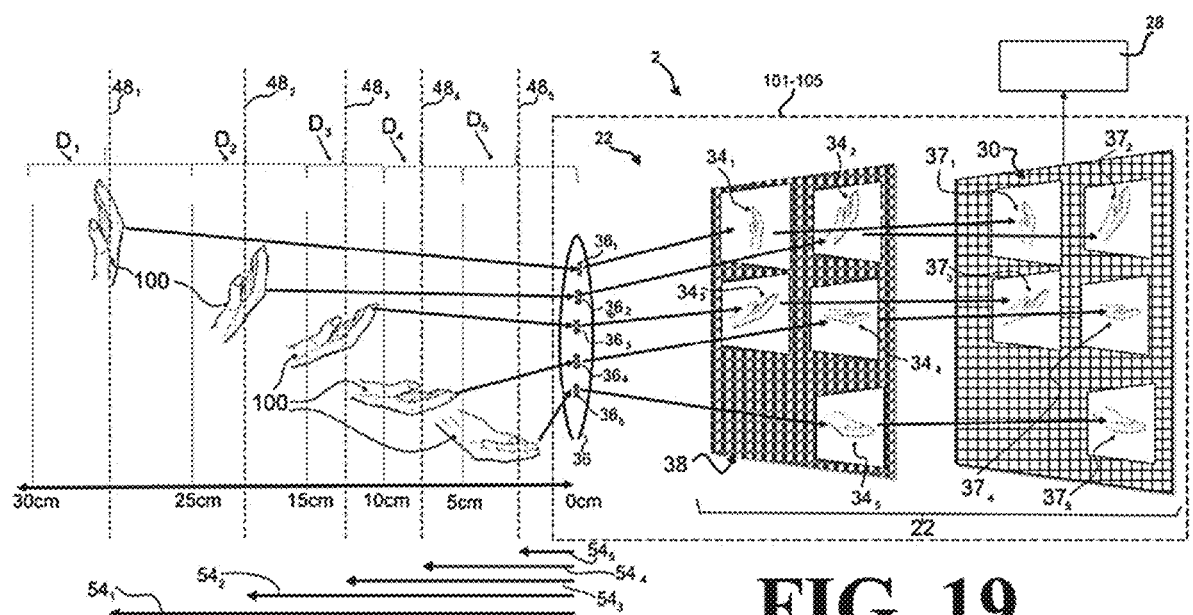
Figures 20, 21:
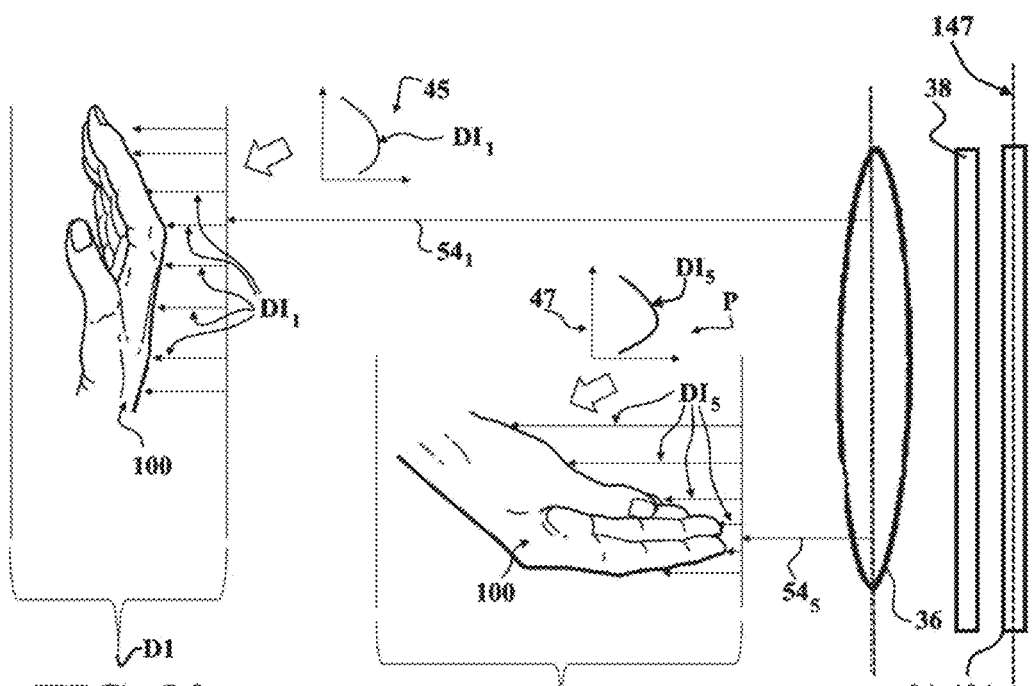
Figure 22:
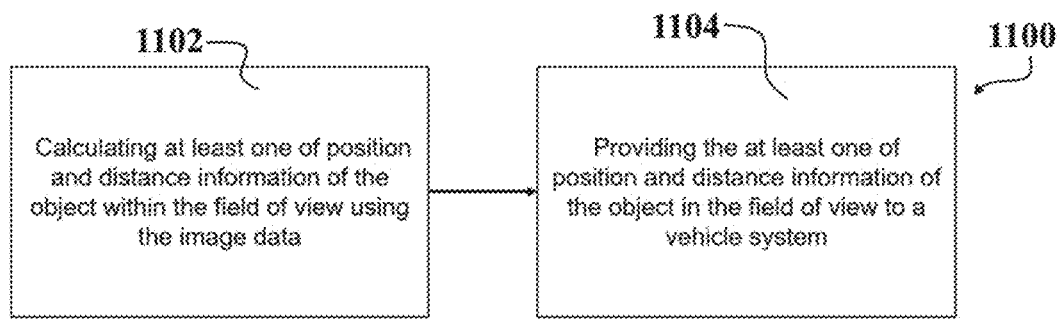
Figure 23:
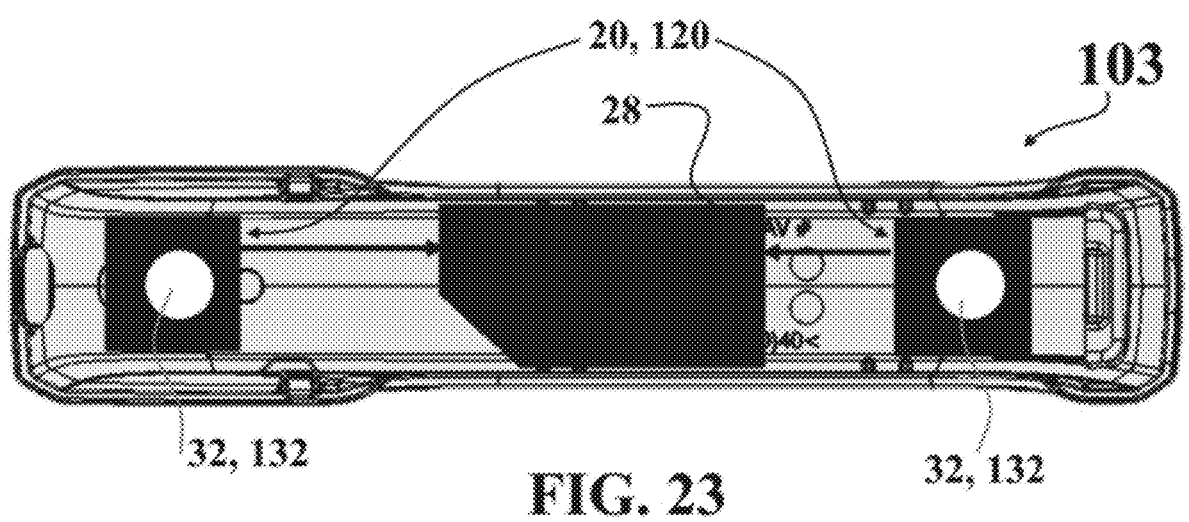
Figure 24:
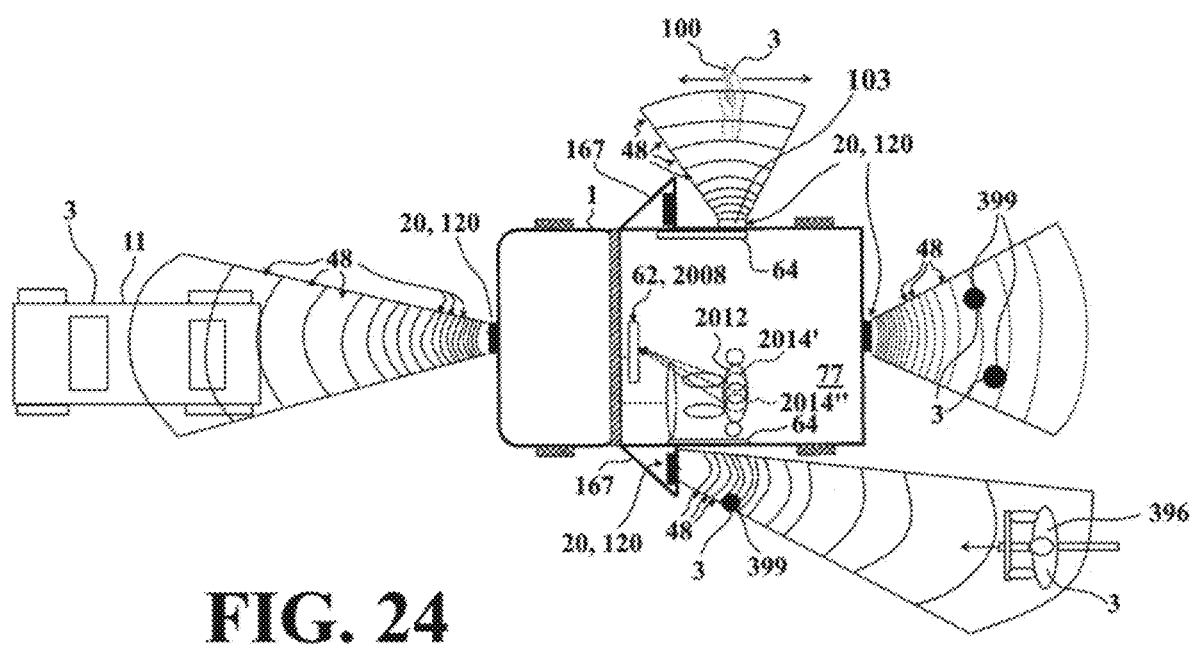
Figure 25:
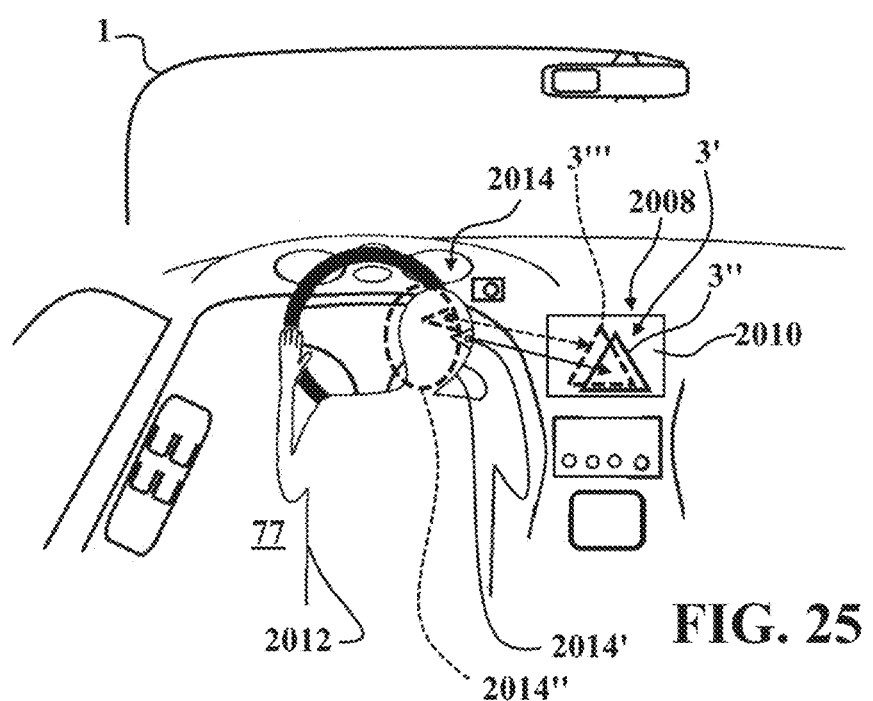
Figure 26:
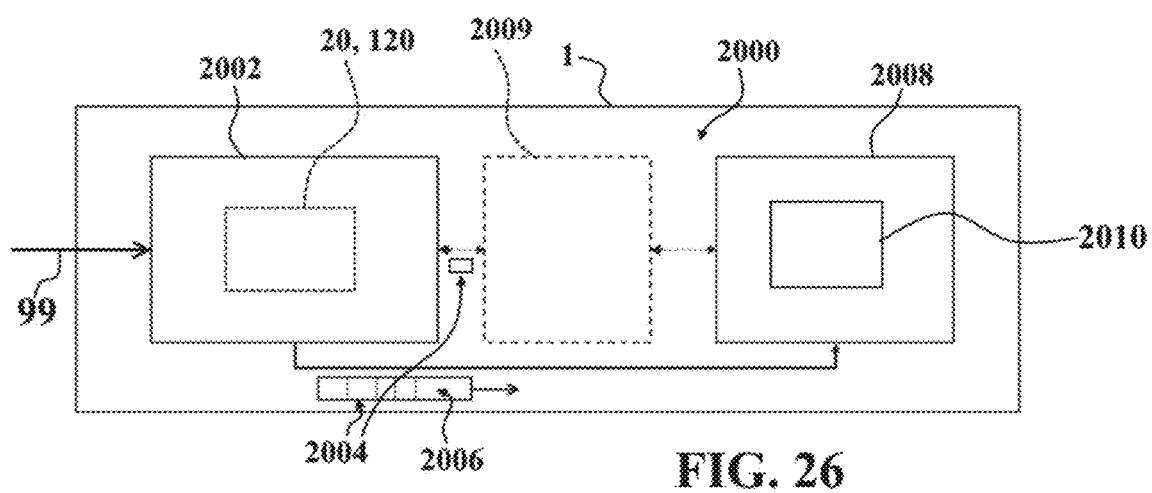

FIGS. 17A-B and 18A-B illustrate steps of a method of image data processing for detecting at least one of a gesture and an obstacle using the digital imaging system, according to aspects of the disclosure;

FIG. 19 shows the digital imaging system measuring the distance from a hand to a vehicle component as part of a gesture detection operation, according to aspects of the disclosure;

FIGS. 20 and 21 schematically illustrate the distances determined by the digital imaging system as part of a gesture detection operation of a hand adopting different positions, according to aspects of the disclosure;

FIG. 22 is an example of a method of detecting an object using a plenoptic, or light field camera, for a motor vehicle, in accordance with an illustrative embodiment;

FIG. 23 is an example of a door handle of a motor vehicle provided with at least one plenoptic camera, and for example with a digital imaging system, providing different fields of view for detecting at least and object and a gesture, in accordance with an illustrative embodiment;

FIG. 24 is a top-view of a motor vehicle illustrating exemplary positioning of a digital imaging systems on the motor vehicle, in addition to surrounding objects detectable by the digital imaging systems, in accordance with an illustrative example;

FIG. 25 is view of an interior of the motor vehicle of FIG. 24 a driver viewing a three dimensional display from different head positions, in accordance with an illustrative example; and FIG. 26 is a block diagram of a vehicular vision system for a motor vehicle, accordance to an illustrative example.

DETAILED DESCRIPTION

In the following description, details are set forth to provide an understanding of the present disclosure. In general, the present disclosure relates to a digital imaging system of the type well-suited for use in many applications. The digital imaging system and associated methods of image data processing of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

Figure 1:
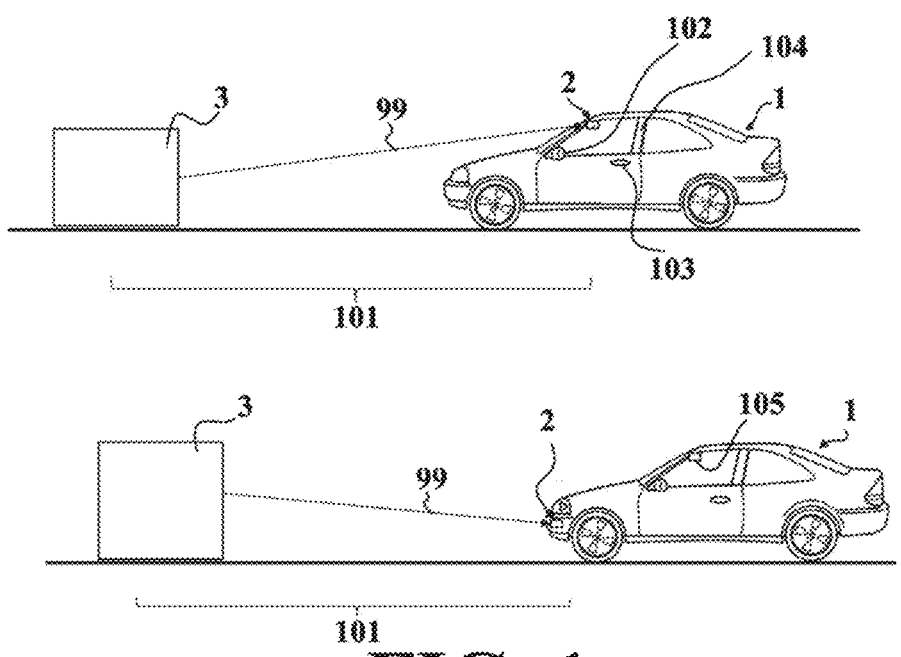
FIG. 1 shows an imaging system of a vehicle for detecting objects in various configurations, according to aspects of the disclosure
Figure 2:
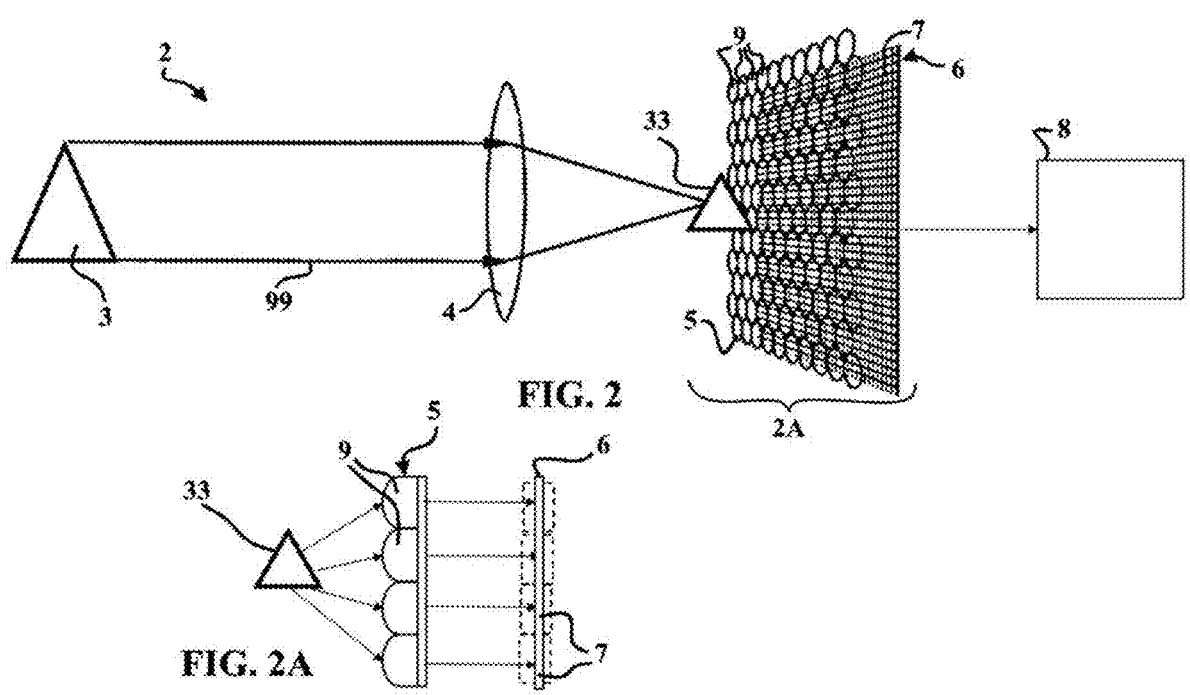
FIG. 2 shows an imaging system of a vehicle for detecting objects, according to aspects of the disclosure.

Referring to the Figures, wherein like numerals indicate corresponding parts throughout the several views. A vehicle 1 may include an imaging system 2 for detecting objects 3 (e.g., at least one of a gesture and an obstacle) within a distance 101 of the vehicle 1, as best shown in FIG. 1. The imaging system 2 may utilize a main lens 4 that has a predefined depth of field (e.g., focusing on objects located at 300 meters from the main lens 4) arranged in front of a microlens array 5 that is located in front of a sensor assembly 6 comprising a plurality of light sensors 7 coupled to a control unit 8, as shown in FIG. 2. However, intermediary objects may appear blurry as projected in front of the microlens array 5 (sets of microlenses 9) in such imaging systems 2. Specifically, the main lens 4 is unable to provide different depths of field at different distances from the main lens 4, thereby losing detail resolution advantageous for obstacle detection. Proper focusing provides improved image resolution for detection of the object 3, and dedicating microlenses 9 with different focal lengths reduces the number of pixels or light sensors 7 of the sensor assembly 6 available to capture the image projected by the main lens 4, consequently resolution is lost.

As shown in FIG. 2, a single intermediary image 33 is focused by the lens 4 in front of the microlens array 5. Lens 4 is shown to be optically coupled with microlens array 5. Accordingly, the light sensors 7 of the sensor assembly 6 capture a different perspective of the single intermediary image. A side view of the microlens array 5 in an optically coupled relationship with light sensors 7, illustrated as an image processing stage using reference numeral 2A is shown in FIG. 2A.

Figure 3:
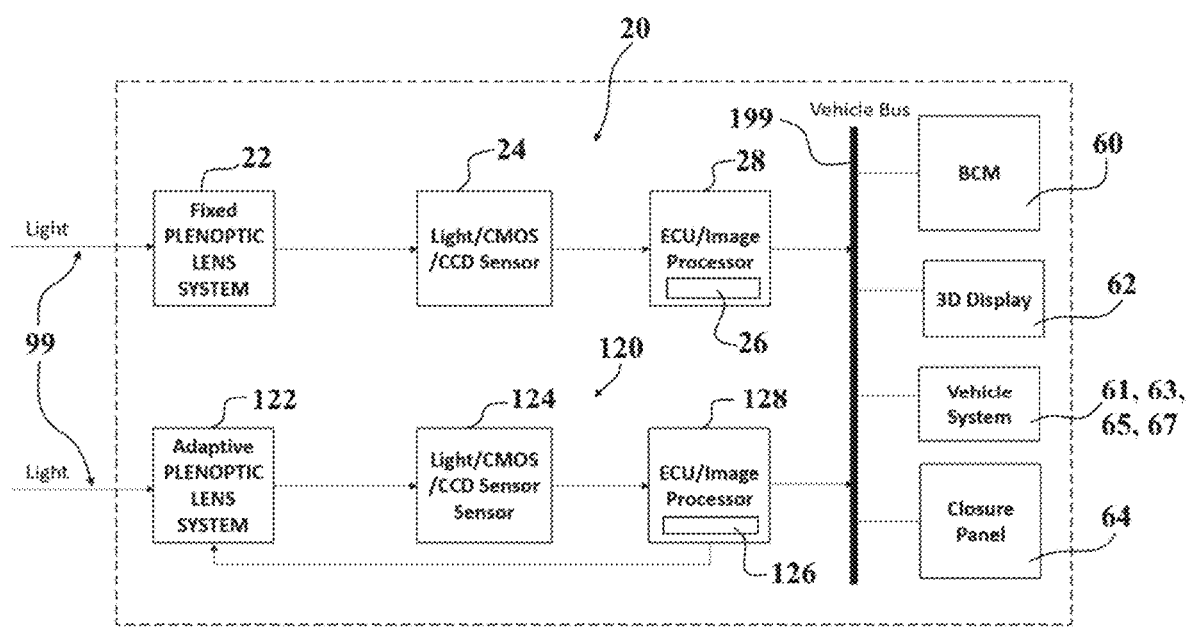
FIG. 3 illustrates a first and second embodiment of a digital imaging system including a plenoptic lens system, according to aspects of the disclosure.
Figure 4:
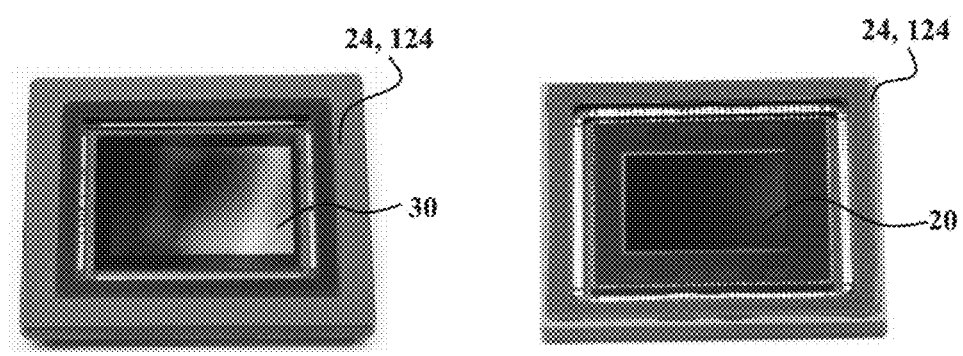
FIG. 4 shows example image sensor assemblies of the digital imaging systems of FIG. 3, according to aspects of the disclosure.

Referring now to FIG. 3, a schematic of a first exemplary embodiment of digital imaging system 20 is shown and includes a plenoptic lens system 22 and an image sensor assembly 24. The plenoptic lens system 22 may be a fixed plenoptic lens system. The image sensor assembly 24 may be a light/CMOS/CCD sensor and configured to output image data, for example from an output signal line in a digital or analog signal format, as examples. The digital imaging system 20 also includes a memory unit 26. Furthermore, the digital imaging system 20 includes a control unit 28 coupled to the image sensor assembly 24 and the memory unit 26 (e.g., the memory unit 26 can be part of the control unit 28 or separate). Example image sensor assemblies 24 are shown in FIG. 4. The image sensor assembly 24 may comprise a two-dimensional pixelated imaging array having a plurality of photo-sensing pixels or light sensors 30 arranged or disposed or established on a semiconductor substrate. For example, the imaging sensor may comprise a complementary-metal-oxide-semiconductor (CMOS) or a CCD imaging sensor or device or the like.

With reference to FIG. 4, the image sensor assembly 24 may be a 120MXS 120MP CMOS sensor. The 120MXS is an ultra-high resolution CMOS sensor with 13272×9176 effectgive pixels (approximately 60× the resolution of Full HD). The size may be 29.22 mm×20.20 mm and a square pixel arrangement of 2.2 micrometers×2.2 micrometers with 122 million effective pixels. Pixel progressive reading of 9.4 fps is made possible 28 digital signal output channels.

With further reference to FIG. 4, the image sensor assembly 24 may be a 3U5MGXS global shutter image sensor equipped with a global shutter and all pixel progressive reading reading at 120 fps, the ⅔ inch, sensor size, and pixel size of 3.4 micrometer with 5.33 million effective pixels (2592×2056).

It will be appreciated that other sensor types may also be used, and that multiple different sensor types may be used in the same array.

Figure 5:
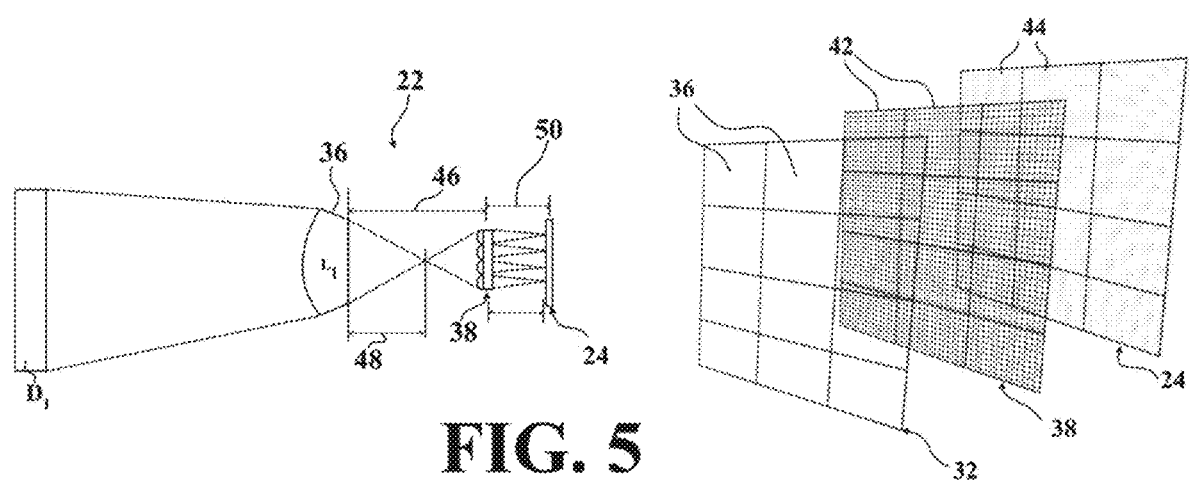
FIGS. 5 and 6 illustrate the plenoptic lens system of the first exemplary embodiment of the digital imaging system, according to aspects of the disclosure.
Figure 6:
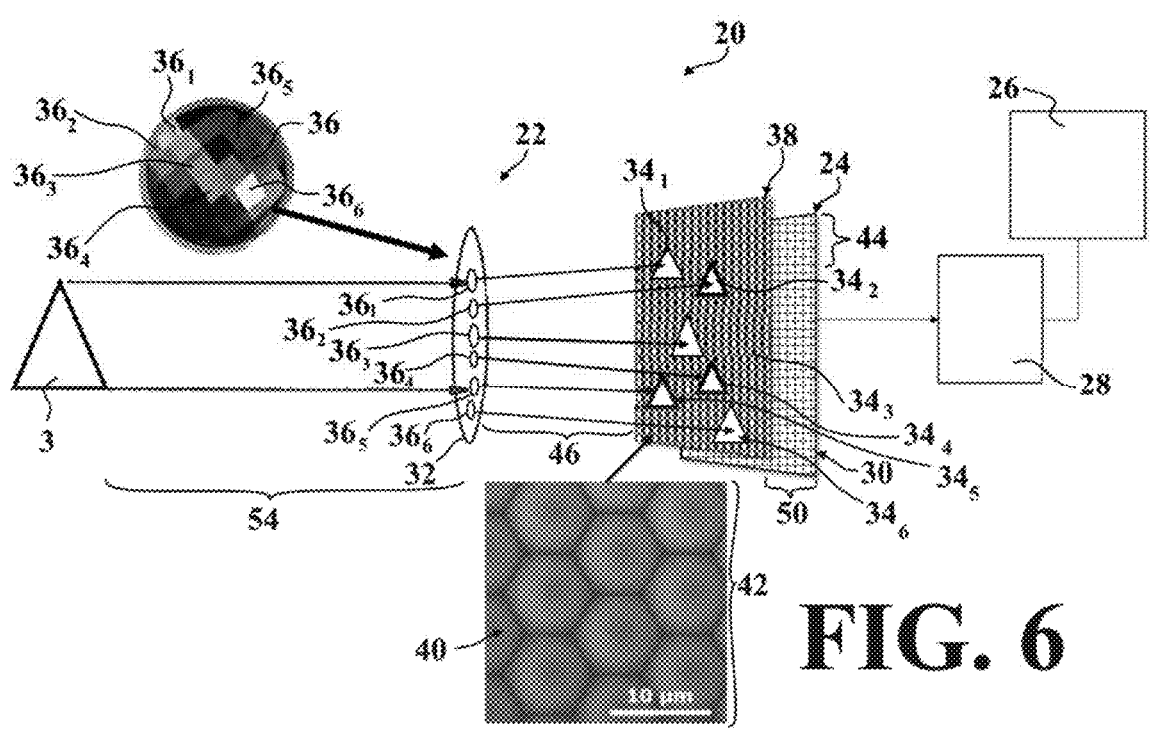

As best shown in FIGS. 5 and 6, the plenoptic lens system 22 includes a main lens 32 configured to focus light 99 from a field of view for a plurality of depths of field, e.g. different or overlapping depths of field, and project a plurality of intermediary images 34 representing the plurality of depths of field. In more detail, the main lens 32 comprises a plurality of main micro lenses 36 (e.g. illustratively shown as having six main micro lenses $36_{1\ to\ 6}$, but it is recognized more can be provided, for example up to 500 depending on the number depths of field of interest) adjacent to and abutting one another to simultaneously focus light 99 from the plurality of depths of field and project the plurality of intermediary images 34 (e.g. six intermediary images $34_{1\ to\ 6}$ each associated with light projected from one of the six main micro lenses $36_{1\ to\ 6}$). Specifically, the plurality of intermediary images 34 are representative of a plurality of portions of the field of view at the plurality of depths of field. While the operation of the plenoptic lens systems described herein are made with reference to light, it is understood that the plenoptic lens systems may be configured to operate with other types of electromagnetic radiation of other spectrums, such as UV, IR, as examples.

In addition, the plenoptic lens system 22 includes an intermediate microlens array 38 disposed between the main lens 32 and the image sensor assembly 24 in a spaced relationship with each of the main lens 32 and the image sensor assembly 24 and including a plurality of intermediate micro lenses 40 adjacent to and abutting one another and grouped into a plurality of microlens sections 42. The intermediate microlens array 38 focuses the plurality of intermediary images 34 from the main lens 32 onto the image sensor assembly 24. For example, the microlens section 42 of the intermediate microlens array 38 MLA1 corresponds with the one of the main micro lenses 36, L1 of the main lens 32 and focuses light onto the portion S1 of the plurality of sensor sub-arrays 44 of the image sensor assembly 24. Each of the plurality of intermediate micro lenses 40 projects the plurality of intermediary images 34 onto one of the plurality of sensor sub-arrays 44 from a different perspective than another of the plurality of micro lenses 40 that is adjacent thereto. Said another way, each of the plurality of intermediate micro lenses 40 projects an intermediary image 34 onto associated pixels of the image sensor assembly 24 from a different angle/perspective than an adjacent intermediate micro lens 40.

With reference to FIG. 5, as shown, the main lens 32 (i.e., each of the main micro lenses 36 of the main lens 32) is disposed a first distance 46 from the intermediate microlens array 38 and the first distance 46 is greater than a main focal length 48 of each of the plurality of main micro lenses 36. The intermediate microlens array 38 is disposed a second distance 50 from the image sensor assembly 24 and the second distance 50 is equal to an intermediate focal length of each of the plurality of intermediate micro lenses 40. Therefore, the main lens 32 is a multifocal lens that projects multiple intermediary images 34 focused in front of designated intermediate micro lenses 40 (of the intermediate microlens array 38). It should be understood that other arrangements or configurations of the main lens 32 and intermediate microlens array 38 are contemplated.

The image sensor assembly 24 is disposed in a spaced relationship with the main lens 32 and including a plurality of light sensors 30 grouped into a plurality of sensor sub-arrays 44. In other words, the image sensor assembly 24 and intermediate microlens array 38 is divided into a number of intermediate microlens arrays 38, each with its own main micro lens 36. Each sensor sub-array 44 is positioned to capture the light from the field of view in a volume, i.e. it also captures the direction of the light. So, each sensor sub-array 44 is configured to capture each of the plurality of intermediary images 34 at a designated depth of field projected onto the sensor sub-array 44 as sub or micro intermediary images 37. Specifically, each intermediary image 34 is focused at a given depth of field and distance 54 from the main lens 32 so detail is not lost. A lower number of intermediary images 34 are produced for a depth of field provide 1% depth resolution, which allows for increasing the number of light sensors 30 capturing an intermediary image 34 at a given depth of field. An example of the sensor sub-arrays 44 is illustrated in FIG. 7, with each sensor sub-array 44 of the plurality of light sensors 30 being 1.2 megapixels.

Figure 7:
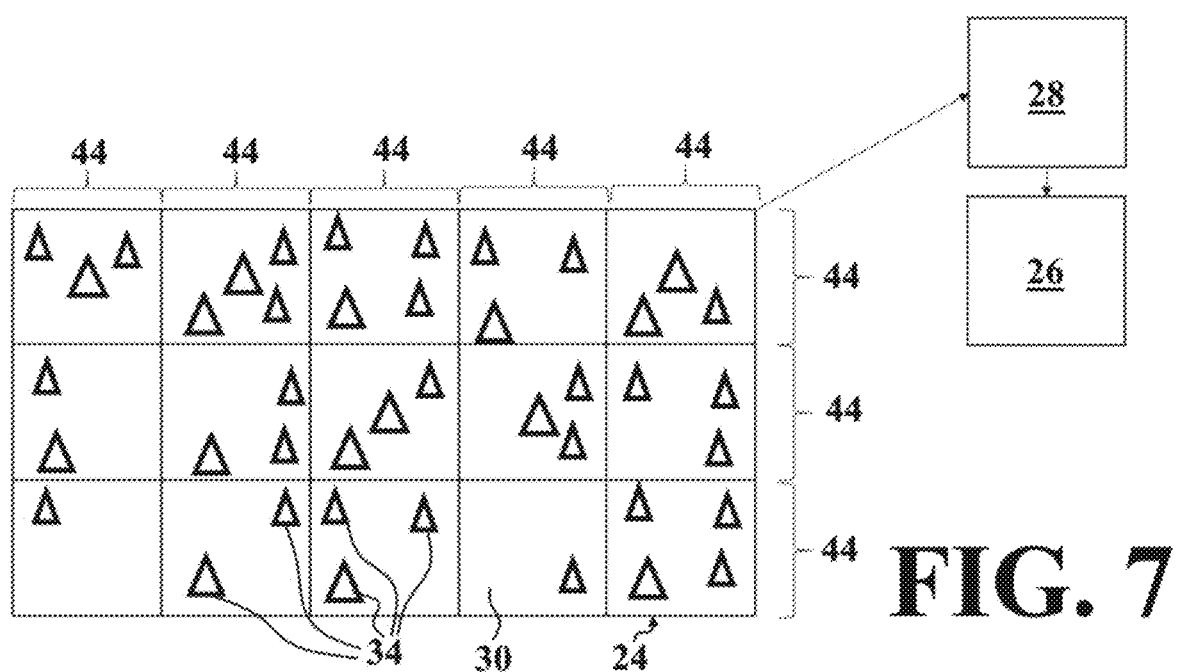
FIG. 7 shows example sensor sub-arrays of the image sensor assembly for the first exemplary embodiment of the digital imaging system, according to aspects of the disclosure.
Figure 8:
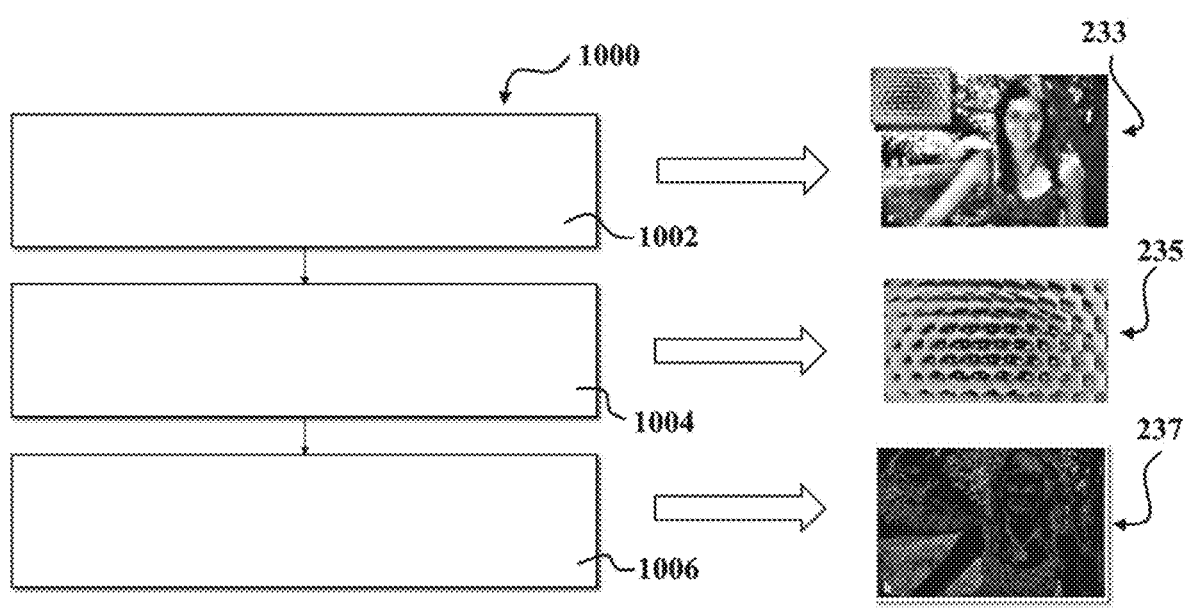
FIG. 8 illustrates the image processing completed by a control unit of the first embodiment of the digital imaging system, according to aspects of the disclosure.

As best shown in FIGS. 7-8, the control unit 28 is configured to receive or capture the image data outputted from the image sensor assembly 24, and for example configured to capture the image data associated with the plurality of intermediary images 34 using the image sensor assembly 24. The control unit 28 is also configured to store the image data associated with the plurality of intermediary images 34 using the memory unit 26 (i.e., the memory unit 26 stores image data associated with the plurality of intermediary images 34). So, the memory unit 26 stores image data associated with the plurality of intermediary images 34. The raw image data recorded by each sensor sub-array 44 consists of the many tiny images created by each of the plurality of intermediate micro lenses 40. The control unit 28 is additionally configured to create a three-dimensional depth map using the image data representing the plurality of intermediary images 34. Neighboring micro or intermediary images 34 show the same point in space in slightly different positions. With this difference the position of this point can be determined in 3D space. When this process is repeated for all pixels or light sensors 30 in all the intermediary images 34, the results in a 3D depth map of the entire field of view. The control unit 28 also calculates distance 54 information of objects 3 in the field of view and detects the at least one of a gesture and the obstacle based on the three-dimensional depth map and distance 54 information. Thus, the digital imaging system 20 provides three dimensional and timing information of one or more object(s) 3 relative to the vehicle 1 that hosts the digital imaging system 20. From the distance information, position information may be calculated, for example if the object off to the side of a center of the vehicle or if the object 3 is at a height above the ground. The information provided may include the X and Y coordinates of an object 3 in the field of view, the distance (Z) 54 between the object(s) 3 and the host vehicle 1, and the time of possible collision based on the speed of the object 3 and the host vehicle 1. So, the control unit 28 is configured to determine distance 54 of the object 3 based on the processing of the differences between images captured for a sensor sub-array 44.

Referring to FIG. 8, there is illustrated a method 1000 including steps which may be executed by control unit 28, and includes the step 1002 of capturing and storing of image data such that the raw image data recorded by each light field sub sensor array (e.g. 44, 144) consists of the many tiny images 233 created by each micro lenses 40, and further the step 1004 of creating a 3D depth map using the stored sub-image data whereby neighboring micro images 235 show the same point in space in slightly different positions. With this difference the position of this point can be determined in a 3D space. When this process is repeated for all pixels in all the micro images, the result is a 3D depth map 237 of the entire image. The method 1000 further includes the step 1006 of calculating distance information and for example calculating the distance using the depth map, whereby distance information of the each portion of the image as a depth map 237 can be calculated. Therefore the distance of the object 3 can be ascertained using optical capturing and image processing techniques.

Figure 9:
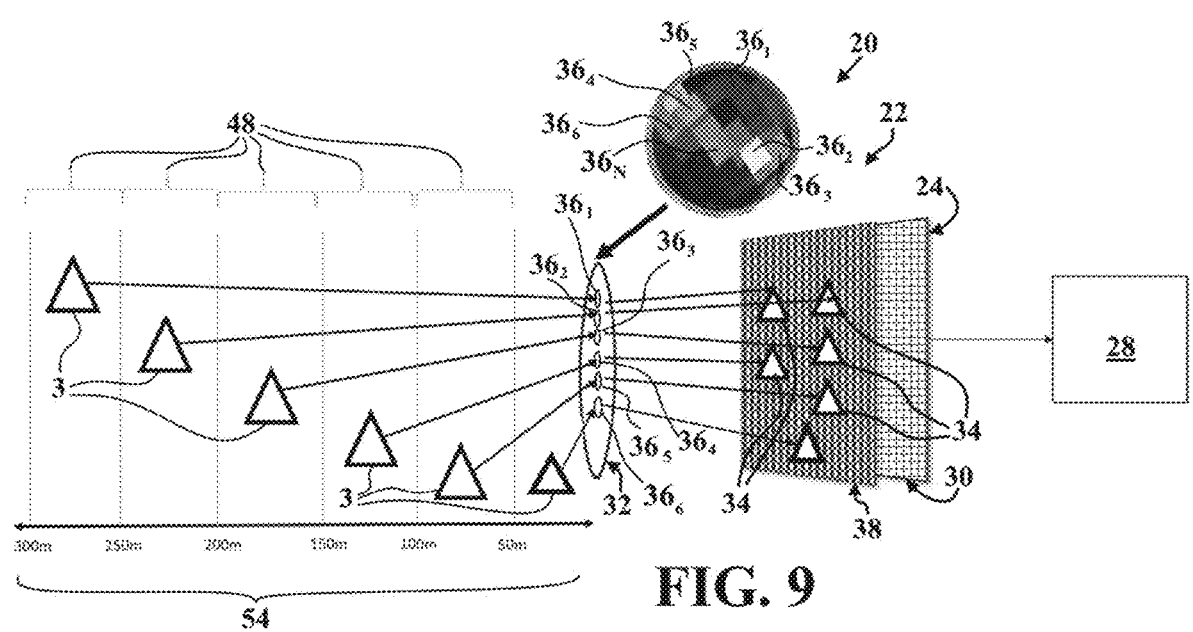
FIGS. 9 and 10 illustrate a plurality of main micro lenses of the main lens of the first embodiment of the digital imaging system have a plurality of main focal lengths selected to project the plurality of intermediary images with the plurality of depths of field being equally spaced from one another, according to aspects of the disclosure.

As best shown in FIG. 9, the plurality of main micro lenses 36 have a plurality of main focal lengths 48 selected to project the plurality of intermediary images 34 with the plurality of depths of field being equally spaced from one another (e.g., every 50 meters). Each intermediary image 34 is focused within a common plane in front of the image sensor assembly 24 based on a distance 54 from the main lens 32, so that each intermediary image 34 within the overall depth of field is in focus to provide proper image resolution.

Figure 10:
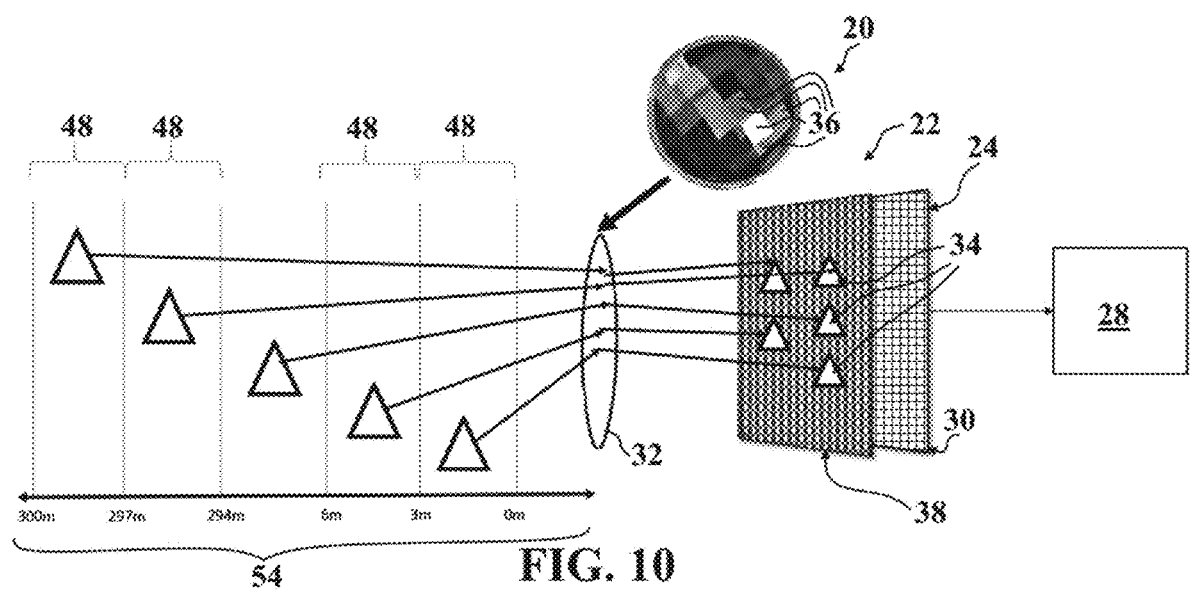

Similarly, FIG. 10 shows the plurality of main focal lengths 48 selected to project the plurality of intermediary images 34 with the plurality of depths of field being equally spaced from one another, yet, more closely spaced than in FIG. 9 (e.g., every 3 meters).

Figure 11:
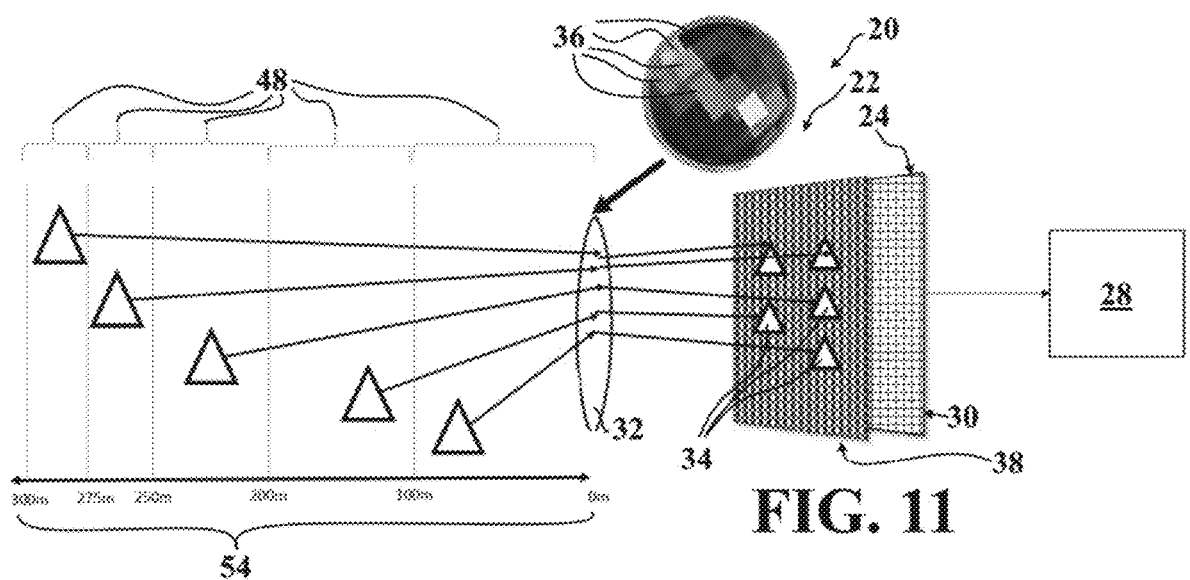
FIG. 11 illustrates the plurality of main micro lenses of the main lens of the first embodiment of the digital imaging system have a plurality of main focal lengths selected to project the plurality of intermediary images with the plurality of depths of field configured to be smaller as distance from the main lens increases, according to aspects of the disclosure.

Alternatively, the plurality of main micro lenses 36 have a plurality of main focal lengths 48 selected to project the plurality of intermediary images 34 with the plurality of depths of field being selected as a function of the distance 54 from the main lens 32. For example, in FIG. 11, the plurality of depths of field are configured to be smaller as distance 54 from the main lens 32 increases. So, the main micro lenses 36 are configured to have smaller depths of field at farther distances 54 (from the main lens 32). Such a configuration may be advantageous for long distance 54 object tracking (e.g., self driving vehicles 1).

Figure 12:
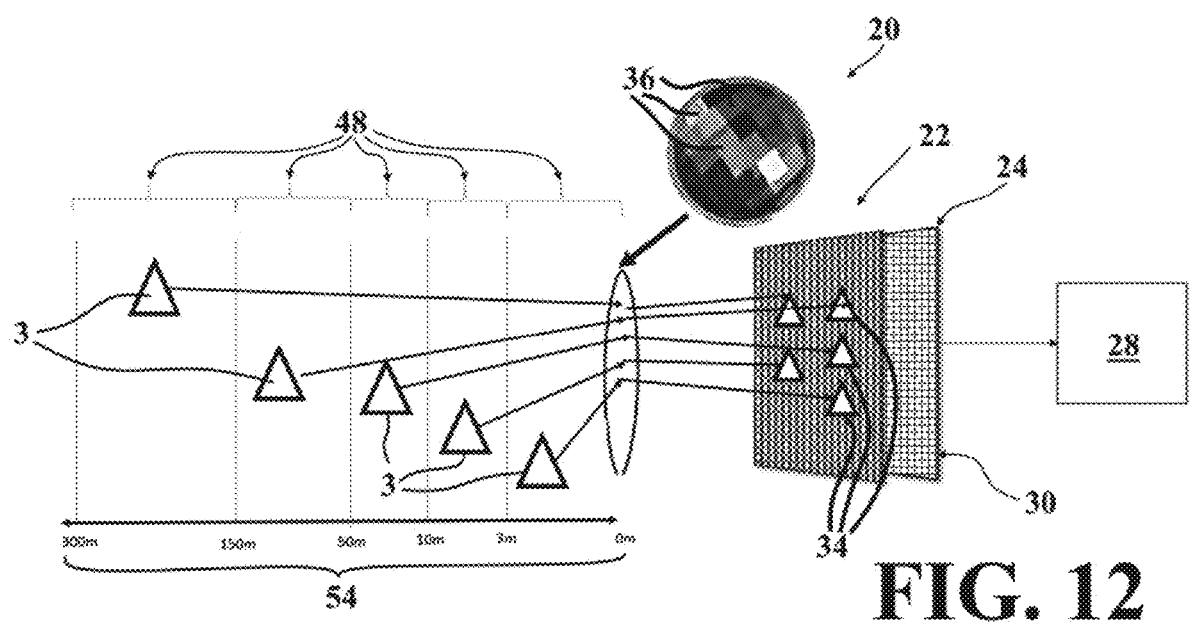
FIG. 12 illustrates the plurality of main micro lenses of the main lens of the first embodiment of the digital imaging system have a plurality of main focal lengths selected to project the plurality of intermediary images with the plurality of depths of field configured to be larger as distance from the main lens increases, according to aspects of the disclosure.

In FIG. 12, the plurality of depths of field are configured to be larger as distance 54 from the main lens 32 increases. Thus, the main micro lenses 36 are configured to have smaller depths of field at closer distances 54 (from the main lens 32), for example, close proximity warning and gesture recognition.

Figure 13:
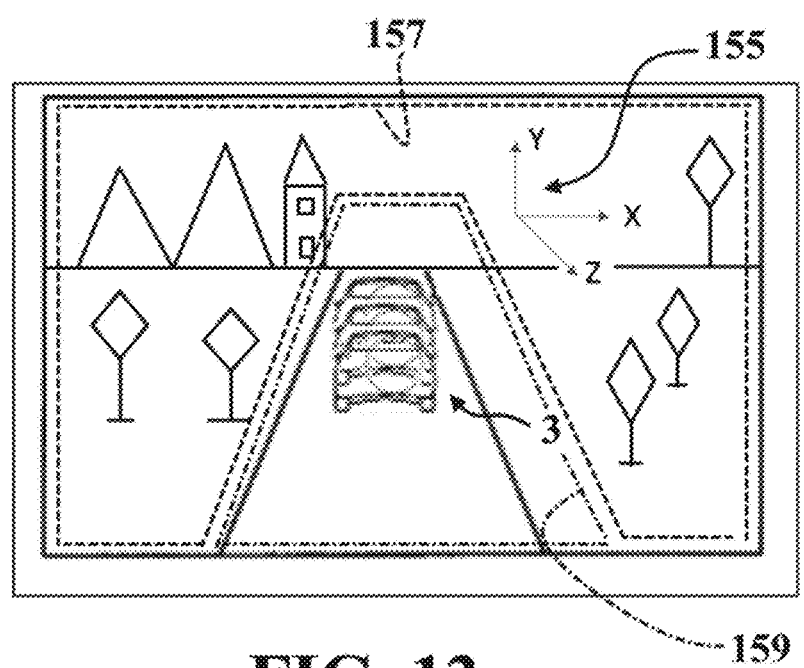
FIG. 13 shows the digital imaging system measuring the distance from the object to the vehicle, according to aspects of the disclosure.

In operation, the digital imaging system 20 measures the distance 54 from an object 3 to the host vehicle 1, as best shown in FIG. 13. By adding the distance 54 information based on the focal point of each microarray to the depth information of the three-dimensional image, an algorithm (e.g., of the control unit 28) can more accurately determine position information of an object 3 or objects. The timing information given by the video frames (a sequence of captured images), along with the host vehicle speed information (read from vehicle bus 199), enables the calculation of the object speeds. The distance 54 and speed information can also feedback to a vision algorithm (e.g., of the control unit 28 or another controller) to help its object identification. In addition, lane mark information adds critical information for applications like adaptive cruise control (ACC) and collision warning. Based on the four-dimensional information of the objects 3 and lane mark information, a map of road objects 3 can be generated. In addition to distance 54 information, position information can be determined based on the image data, for example the three-dimensional image, based on the identification of coordinates 155 the object 3 in the Y and X directions for example. Also, occluding of background image data 157, shown to include objects such as signs, trees, buildings, sidewalk pedestrians and the like may be not processed for determining position and distance information. Such occluding may be based on predetermined areas of the captured image based on the coordinates X and Y, or as a result of a determination by an artificial intelligence algorithm as examples. An area of interest 159 may be also be determined in a similar manner, shown for example to include an area associated with a road upon which a vehicle as the object 3 being ahead of the vehicle 1 when the digital imaging system 20 is forward facing such as shown in FIG. 1. As a result, less image data is required to be processed since data associated with background image data 157 is not processed, while only areas of interest 159 are processed.

Figure 14:
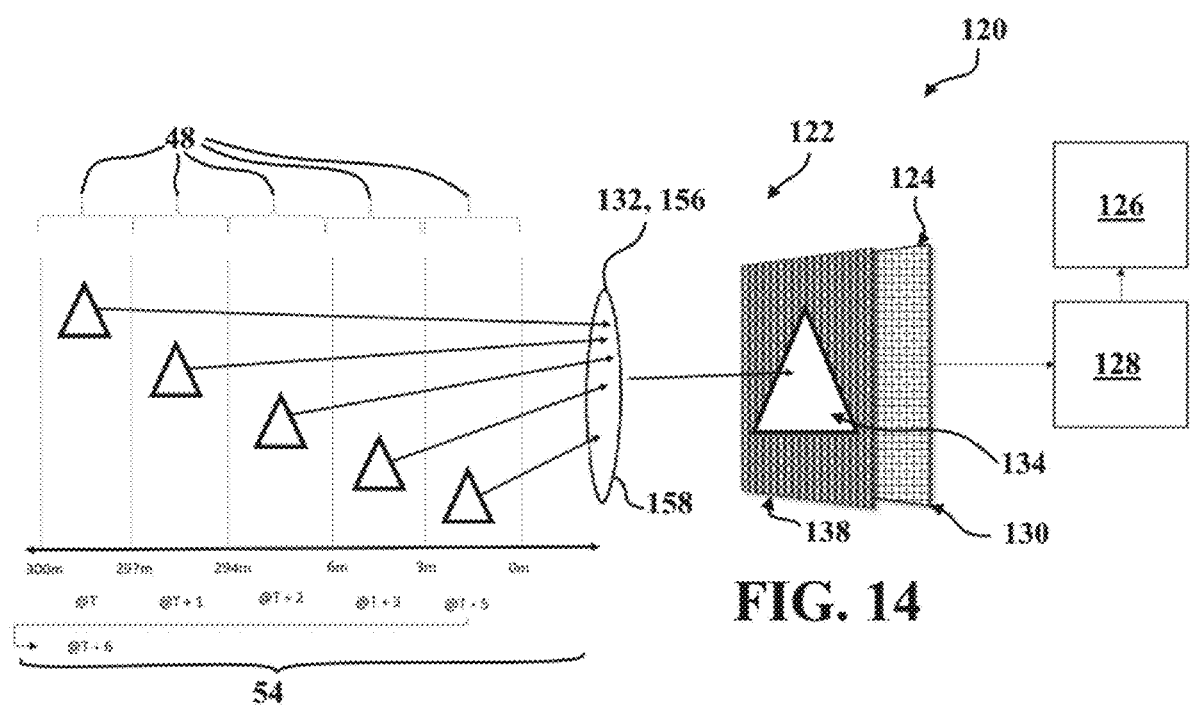
FIGS. 14 and 15 illustrate the second exemplary embodiment of the digital imaging system, according to aspects of the disclosure.
Figure 15:
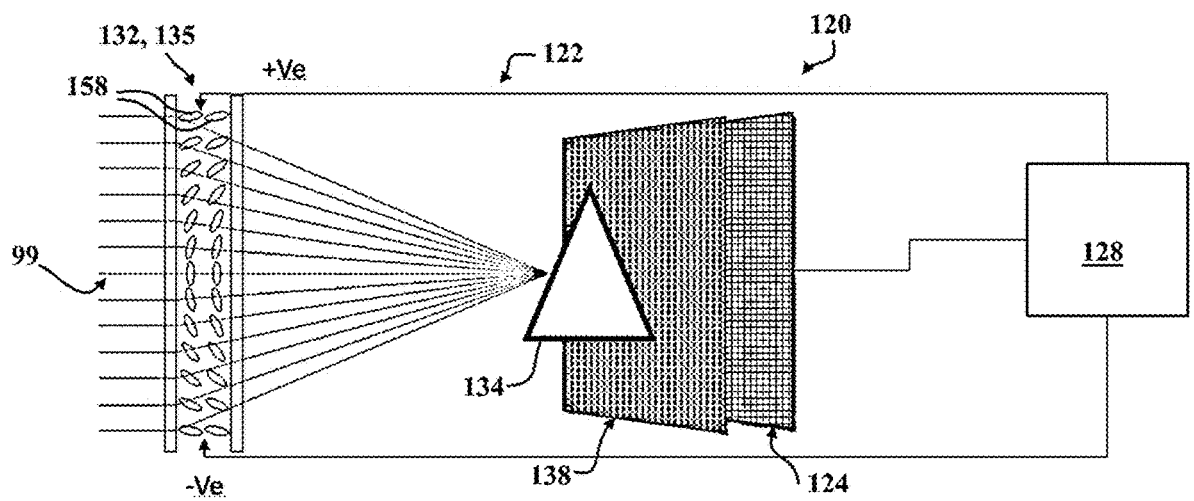

As best shown in FIGS. 14 and 15, a second exemplary embodiment of the digital imaging system 120 is provided. In contrast to the first exemplary embodiment of the digital imaging system 20, the main lens 132 of the plenoptic lens system 122 comprises a birefringent lens 156 including at least one layer of liquid crystals 158 (FIG. 15) being movable by an applied current or voltage to individually focus light from the plurality of depths of field and project the plurality of intermediary images 134 sequentially (e.g., at time T, then time T+1, time T+2, etc.). A current twists the crystals 158. Since the index of refraction varies with the direction of light travel thru each crystal 158, a lensing effect can be obtained (i.e., virtual micro lenses). Compared to the main micro lenses 36, the advantage of the birefringent lens 156 is that the number of virtual micro lenses and their focal lengths can be changed as needed. Birefringent lens 156 is an illustrative example of a lens having a controllable focal length, and for example may be a controllable birefringent lens. One example of a control of the birefringent lens 156 may be to control the birefringent lens 156 to focus light from the plurality of depths of field and project the plurality of intermediary images sequentially, such that the plurality of intermediary images are representative of the field of view at each of the plurality of depths of field, wherein the control unit 28, 128 is configured to control the controllable birefringent lens 156 to focus light 99 from each of the plurality of depths of field and project the plurality of intermediary images 34 in sequence over a predetermined period of time.

Consequently, the plurality of intermediary images 134 from the birefringent lens 156 are representative of the field of view at each of the plurality of depths of field. Thus, the control unit 128 is configured to supply the applied current to the at least one layer of liquid crystals 158 to individually focus light from each of the plurality of depths of field and project the plurality of intermediary images 134 in sequence over a predetermined period of time. So, for example, the birefringent lens 156 scans the distance 0 meters to 300 meters incrementally and alters focus for each depth of field to project an intermediary image 134 in front of the intermediate microlens array 138.

Figure 16:
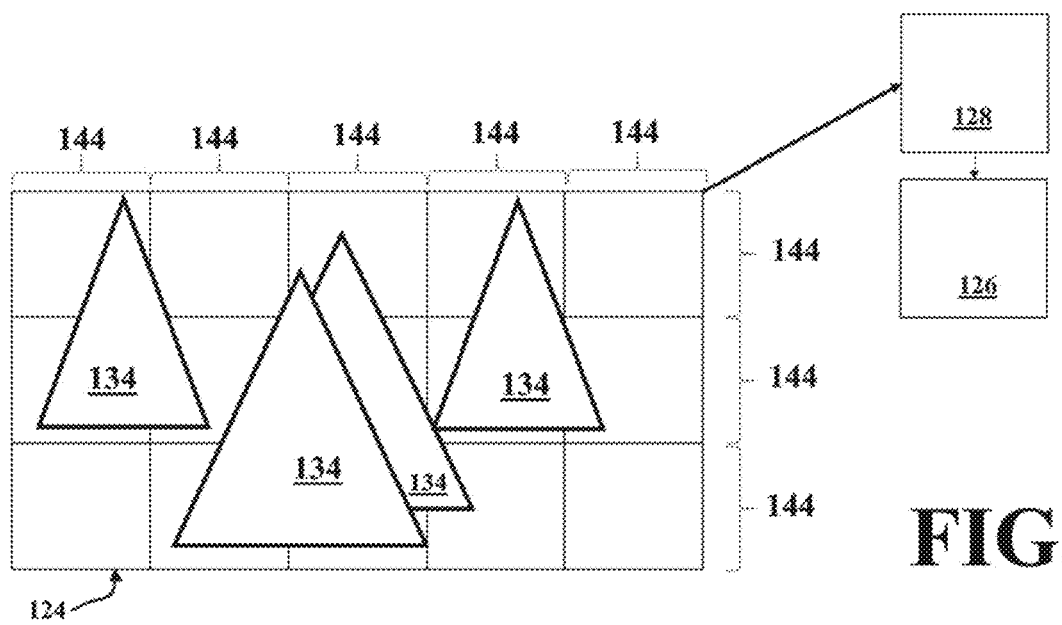
FIG. 16 shows example sensor sub-arrays of the image sensor assembly for the second exemplary embodiment of the digital imaging system, according to aspects of the disclosure.
Figure 17A:
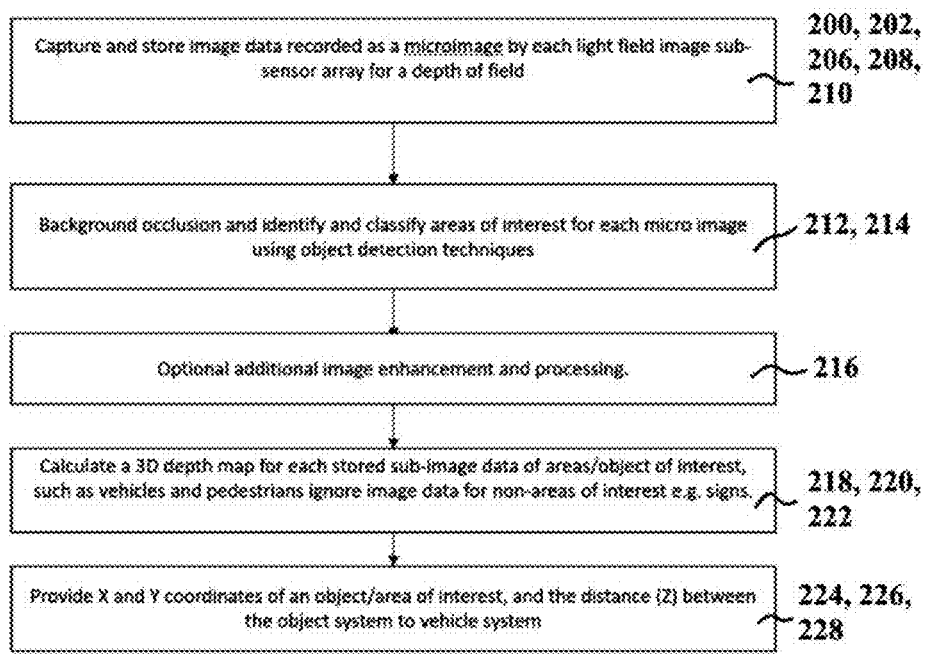
Figure 17B:
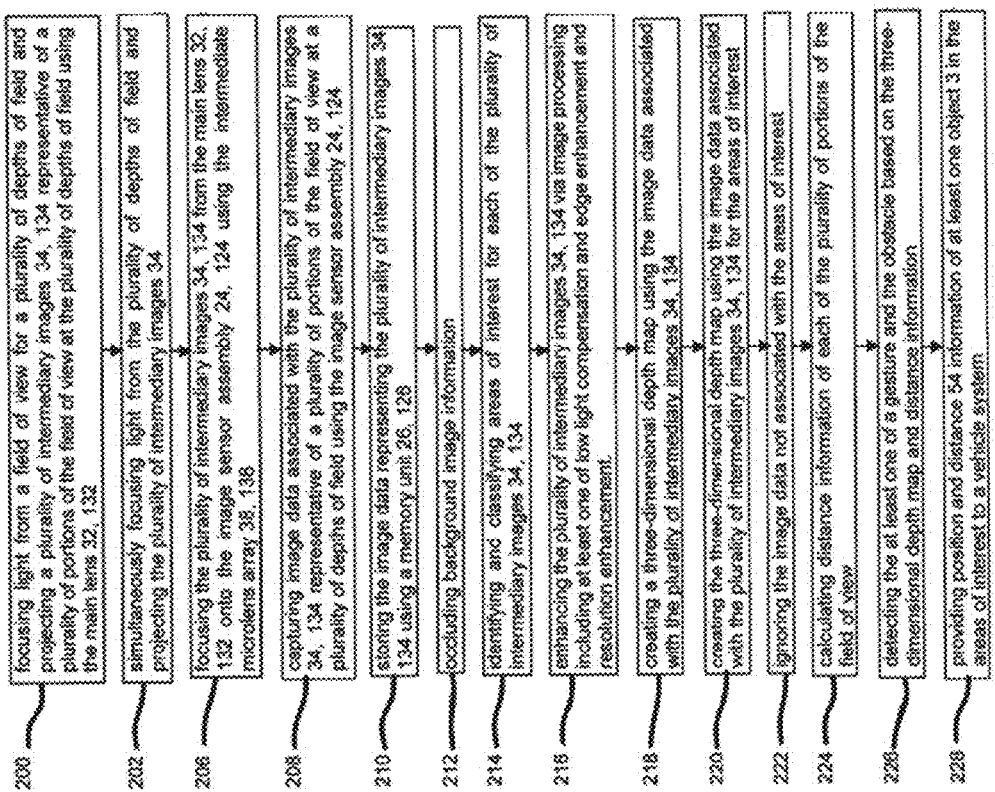
Figure 18A:
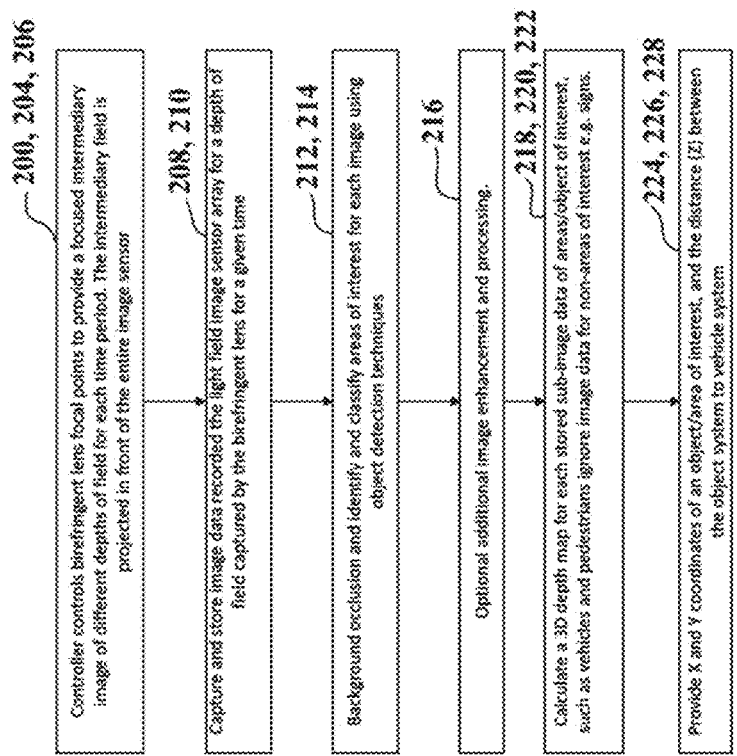
Figure 18B:
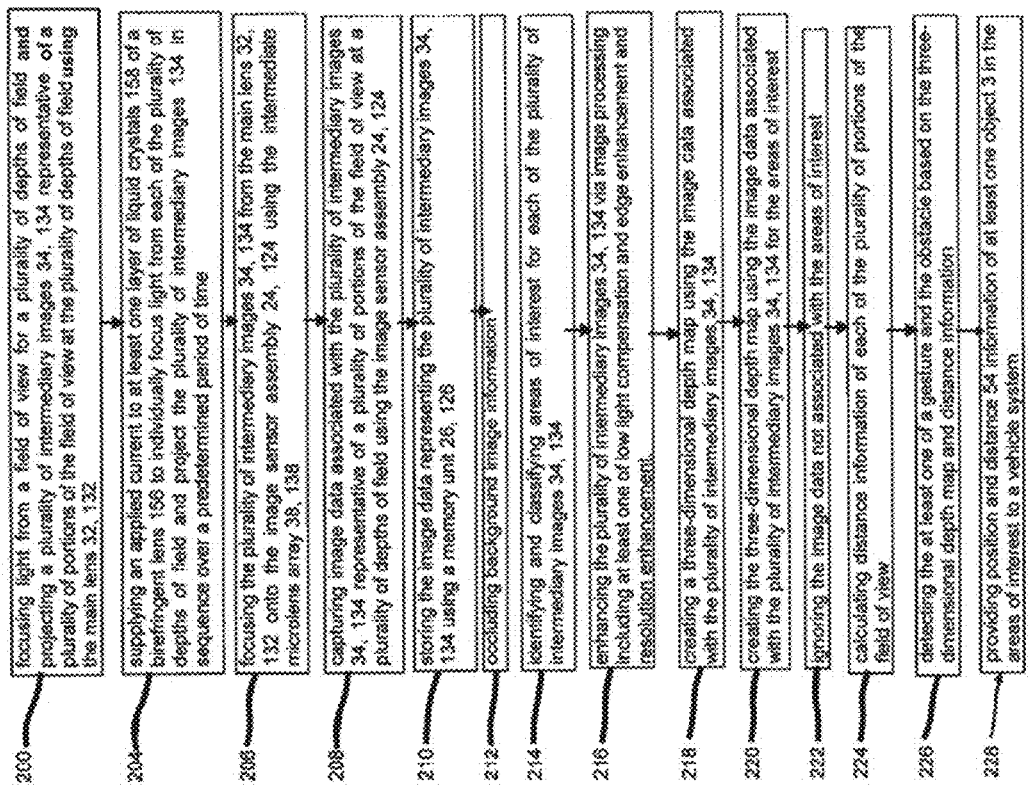

As shown in FIG. 16, the controlled focus of the birefringent lens 156 allows for each of the plurality of intermediary images 134 to be focused at a given depth of field and captured by the image sensor assembly 124 (at a particular moment in time). So, each of the plurality of intermediary images 134 is captured by the image sensor assembly 124 in a focused state and the entire image sensor assembly 124 (e.g., the plurality of sensor sub-arrays 144) is used to capture each of the plurality of intermediary images 134 and store the plurality of intermediary images 134 to the memory unit 126 at a high resolution. The birefringent lens 156 projects a larger intermediary image 134 per time period, and per depth of field that is captured and stored providing an increased resolution for each depth of field.

Referring back to FIG. 3, and FIG. 24, the control unit 128 is further configured to provide position and distance information of at least one object 3 to vehicle systems 60, 62, 64. For example the distance information may be a distance from the number of surfaces of the object 3 to a view point, or reference point 147 illustratively shown as the image sensor 24, 124, of the digital imaging system 20, 120, such as the focus point intermediate microlens array 38, 138 onto the plane of the image sensor 24, 124 for example. Vehicle system 60 may be an obstacle detection system 61 which may be configured to determine at which threshold distance the closure panel 64 movement may be controlled to cease based on the position of the closure panel 64 and the provide position and distance information e.g. if the closure panel 64 is at a 45 degree opened position moving towards a full opened position and the provided position and distance information indicates an object, such as a pole 399, or persons as examples positioned within the path of the closure panel 64 opening at 75 degrees opened, the obstacle detection system 61 may command a power actuator coupled to the closure panel 64 to stop movement of the closure panel 64. Vehicle systems 60 may include a gesture detection/recognition system 63 which may be configured to determine a gesture 397 by a user for expressing their intent to control the vehicle 1, for example to control an unlocking of a closure panel 64, an powered activation of the door panel 64, and/or control of other vehicle functions such as window opening/closing, vehicle ignition, alarms and so on and so forth. Gesture detection/recognition system 63 may receive the provided position and distance information, for example position and distance information related to an object being a foot, a hand, and performing a gesture, such as a swipe in which the hand or foot may change in distance and position relative to the digital imaging system 20, 120. For example a side to side swipe of a hand may change its distance from the digital imaging system 20, 120 and then away from the digital imaging system 20, 120 as it moves from left to right in one direction as an example, as its position change relative to the digital imaging system 20, 120 which both can be detected and determined by the digital imaging system 20, 120. Based on a prestored data sequence in memory of the digital imaging system 20, 120 and/or the gesture detection/recognition system 63 which is matched by the control unit of one of digital imaging system 20, 120 and/or the gesture detection/recognition system 63 with the provided position and distance information representing the gesture, the gesture detection/recognition system 63 may command another vehicle system, such as a power lock actuator of a vehicle latch, a DC motor of a power actuator for moving the closure panel 64, as examples. Vehicle systems 60 may include an advanced driver-assistance systems (ADAS) 65, which is an electronic system configured to assist the vehicle driver with driving the motor vehicle 1 or during parking (backing up) as examples. For example the advanced driver-assistance systems (ADAS) 65 may be configured to receive the provided position and distance information which indicates an object, such as another vehicle 11 ahead of the vehicle 10 is changing position rapidly towards the front of the vehicle 10, perhaps indicating the other vehicle 11 is braking, and determine the other vehicle 11 is now within a threshold safety distance to the front of the vehicle 1 and as a result control the brakes of the vehicle 1 to slow the vehicle 1 so that vehicle 1 does not contact vehicle 11. Vehicle systems 60 may include an alert or warning system 67, which is an electronic system configured to alert, for example by an audible alert, the vehicle driver or an object in proximity to the vehicle 1, for example a cyclist 395 approaching the side of the vehicle 1. For example the warning system 67 may be configured to receive the provided position and distance information from a digital imaging system 20, 120 provided in a side rear view mirror 167 which indicates an object 3, such as cyclist 395 is approaching the driver's side front door closure panel 64 e.g. the distance of the object is determined to be decreasing and in a position moving towards the driver's side front door closure panel 64 and in response control an audible alert to warn the driver of the cyclist 395, or control another vehicle system such as a brake device to stop the movement of the closure panel 64. Other vehicle systems may be configured to receive the provided position and distance information from a digital imaging system 20, 120. While the second exemplary embodiment of the digital imaging system 120 can be used instead of the first exemplary embodiment of the digital imaging system 20, it should be appreciated that both could be used on a single vehicle 1 at the same time (both connected to single vehicle 1 bus 199 for communicating with the vehicle systems 60, 62, 64). So, the digital imaging systems 20, 120 may be suitable for use in connection with other vehicle systems 60, 62, 64, such as, for example, a blind spot detection system, where a blind spot indicator may be operable to provide an indication to the driver of the host vehicle 1 that an object 3 or other vehicle 1 has been detected in the lane or area adjacent to the side of the host vehicle 1. Other systems including a body control module 60 (BCM), display 62, or closure panel system 64 (e.g., operated by a gesture) may be used.

As best shown in FIGS. 17A-18B, a method of image data processing for detecting at least one of a gesture and an obstacle using a digital imaging system 20. As discussed above, the digital imaging system 20, 120 includes a main lens 32, 132 (as part of the plenoptic lens system 22, 122) and an image sensor assembly 24, 124 disposed in a spaced relationship with the main lens 32, 132. The digital imaging system 20, 120 also includes an intermediate microlens array 38, 138 (as another part of the plenoptic lens system 22, 122) disposed between the main lens 32, 132 and the image sensor assembly 24, 124 in a spaced relationship with each of the main lens 32, 132 and the image sensor assembly 24, 124.

The method begins with the step of 200 focusing light from a field of view for a plurality of depths of field and projecting a plurality of intermediary images 34, 134 representative of a plurality of portions of the field of view at the plurality of depths of field using the main lens 32, 132.

If the main lens 32, 132 comprises a plurality of main micro lenses 36 adjacent to and abutting one another, the step of 200 focusing light from the field of view for the plurality of depths of field and projecting the plurality of intermediary images 34, 134 representative of the plurality of portions of the field of view at the plurality of depths of field using the main lens 32, 132 includes the step of 202 (FIGS. 17A and 17B) simultaneously focusing light from the plurality of depths of field and projecting the plurality of intermediary images 34.

In the case of the main lens 32, 132 comprising a birefringent lens 56, the step of 200 focusing light from the field of view for the plurality of depths of field and projecting the plurality of intermediary images 34, 134 representative of the plurality of portions of the field of view at the plurality of depths of field using the main lens 32, 132 includes 204 (FIGS. 18A and 18B) supplying an applied current to at least one layer of liquid crystals 158 of a birefringent lens 156 to individually focus light from each of the plurality of depths of field and project the plurality of intermediary images 134 in sequence over a predetermined period of time. Thus, the birefringent lens 156 provides a robust non-mechanical configuration to change the focal points and project images in focus of different depths of field The next step of the method is 206 focusing the plurality of intermediary images 34, 134 from the main lens 32, 132 onto the image sensor assembly 24, 124 using the intermediate microlens array 38, 138. The method proceeds with the step of 208 capturing image data associated with the plurality of intermediary images 34, 134 representative of a plurality of portions of the field of view at a plurality of depths of field using the image sensor assembly 24, 124.

If the main lens 32, 132 includes a plurality of main micro lenses 36 (FIG. 17), images are captured for each depth of field, the entire scene can be captured at a time point. Raster scanning having a time delay between rasters is not performed. Each depth of field is configured to be provided with 1% depth of field for high resolution of the captured images. In contrast, for the birefringent lens 156, the entire image sensor assembly 124 is utilized to capture the intermediary image 134 in high resolution, and the intermediary field is projected in front of the entire image sensor.

The method continues by 210 storing the image data representing the plurality of intermediary images 34, 134 using a memory unit 26, 126. The method may also include the step of 212 occluding background image information. For the main lens 32, 132 comprising the plurality of main micro lenses 36 (FIG. 17), image processing is limited to only certain pixels or light sensors 30 related to an area of interest. An artificial intelligence algorithm can be used, for example. A less powerful image processor (e.g., control unit 28) is required to perform calculations in a shorter amount of time due to less data being process. Additionally, the method can also include the step of 214 identifying and classifying areas of interest for each of the plurality of intermediary images 34, 134. The method can additionally include the step of 216 enhancing the plurality of intermediary images 34, 134 via image processing including at least one of low light compensation and edge enhancement and resolution enhancement. Since the entire scene or field of view is captured in the memory unit 26, 126 for a given time, additional image enhancement processing can be performed e.g., to compensate for low light, enhance edges, enhance resolution etc. The higher resolution image provides more information to process.

The method then includes the step of 218 creating a three-dimensional depth map using the image data associated with the plurality of intermediary images 34, 134. In more detail, the step of 218 creating a three-dimensional depth map using the image data associated with the plurality of intermediary images 34, 134 can include the steps of 220 creating the three-dimensional depth map using the image data associated with the plurality of intermediary images 34, 134 for the areas of interest and 222 ignoring the image data not associated with the areas of interest. Each image is associated with a depth of field at a predefined distance 54. Data information is known. Each depth map provides additional distance information within a depth of field for providing high accuracy distance data. For example, the distance information may be calculated from the view point, or reference point, of the plane 147 of the image sensor 24, 124, as illustrated in FIG. 21 as an example.

The next step of the method is 224 calculating distance information of each of the plurality of portions of the field of view. The method also includes the step of 226 detecting the at least one of a gesture and the obstacle based on the three-dimensional depth map and distance information. The method can also include the step of 228 providing position and distance 54 information of at least one object 3 in the areas of interest to a vehicle system. The vehicle system may, for example, include at least one of a vehicle detection and ranging system and a gesture recognition system and a biometric identification system and a vehicle detection system.

The digital imaging systems 20, 120 disclosed herein provide numerous advantages. In traditional LIDAR systems that provide and process a full field of view, the beam is scanned in raster fashion, or multiple detectors are scanned in sequence, in which case an equal amount of time is allocated to all of the objects 3 in the field of view. However, the digital imaging systems 20, 120 disclosed herein can assign different amounts of "staring" time to the different objects 3. No tracking is required. In addition, no LIDAR source is required, the plenoptic lens system 22, 122 captures naturally occurring light. Each microimage or intermediary image 34, 134 captured by the image sensor assembly 24, 124 can be processed to enhance the image in low light scenarios. By nature, the objects 3 being tracked move slow in the horizontal and vertical X, Y directions in the field of view, and quickly in the Z direction. No mechanical or raster scanning is required, and the entire X Y and Z scene may be captured in one instance. In addition, post processing of image data can mask non-important scene space e.g. the sky, and therefore the system does not have to waste scanning time in most of the "empty" space or spaces in the field of view that have no objects 3 of interest. As a result, the digital imaging systems 20, 120 can provide faster scene sampling rate or tracking speed than the regular raster scan LIDAR system or multiple detector system. The entire depth of field can be captured by an off the shelf high resolution CMOS image sensor assembly 24, 124. No mechanical scanning is required which requires additional time to capture the entire depth of field, which may lead to a lower cost and higher durability of the scanning mechanics. Traditional raster scanning LIDAR systems evenly spread the beam in the full field of view and therefore has a shorter exposure time for each and every object 3 in the field of view. Fast moving objects 3 are tracked with less resolution. Without wasting time on raster scanning, the current system can provide significantly improved distance sampling rates than regular LIDAR and Radar.

Another advantage is that the digital imaging systems 20, 120 may provide a more efficient and accurate distance measurement, since each intermediary image 34, 134 is tuned to be in focus for a particular sub-field of view. Also, as the field of view is capture at a point of time, this data stored in the memory unit 26, 126 can be processed as required during post processing. For example, areas of interest can be subject to more computationally demanding processing. The digital imaging systems 20, 120 allow more images to be collected over a shorter period of time, and special algorithms or techniques to be applied to stored image data to enhance the detection sensitivity and confidence level.

The digital imaging systems 20, 120 of the present disclosure may provide more accurate measurement of the distance 54 because the object detection in the three dimensional space of the plenoptic lens system 22, 122 provides more detailed depth information or depth data within a depth of field. In addition, the distance reading of an object 3 increases the confidence level of the three dimensional vision object detection. Another benefit of being able to "stare" longer on the object 3 and apply post processing of the image as required to provide enhanced performance in adverse weather conditions, such as rain or fog. One known disadvantage of known LIDAR systems is the difficulty the LIDAR system has in seeing long distances 54 through rain or fog. The light is scattered or diffused by the water droplets in the rain and fog and causes the return light signal to be too weak to detect. However, by controlling a birefringent lens 156, entire scenes at a particular depth of field can be captured for longer periods of time for gathering more information for analysis. More light can be gathered and subsequently special methods and algorithms can be applied to the image data to enhance the detection sensitivity and confidence level. The image sensor assembly 24, 124 or camera vision sensors provide high lateral and vertical resolution and the mature imaging processing technology allows sufficient or enhanced object identification, lane mark detection, and/or the like in high speed by utilizing mature color CMOS or CCD imagers. Image sensor assemblies 24, 124, like that described herein, are mature technologies with relative lower costs as compared with other competing technologies, such as Radar or the like.

The digital imaging systems 20, 120 provide advantages in performance (such as high resolution in lateral, vertical and longitudinal dimensions; high detection and tracking speed; and reliable object 3 identification and tracking), costs (such as due to the ability to use industry standard image sensor assemblies 24, 124 and image processors), size (smaller package size; and no mechanical moving parts) and integration with existing vision-based systems, such as LOW, IHC, AFS, TSR and/or night vision systems and/or the like. Applications of the digital imaging systems 20, 120 include (i) adaptive cruise control (ACC), (ii) Stop and Go; (iii) pedestrian detection; (iv) collision warning at both front and rear sides of the vehicle 1; (v) predictive brake assist; (vi) side object detection, (vii) side blind zone object detection; (viii) rear blind zone object detection; (ix) parking assist; and/or (x) lane change aid detection (a side object detection system may include both blind zone and lane change aid functions) and/or the like. Therefore, the digital imaging systems 20, 120 provide enhanced processing techniques over prior art technology, including scanning LIDAR (which scans the whole field of view and has a slower tracking speed and is not as good at identifying objects 3 in a complex scene and is not as good at detection in fog or rain); Radar (which is expensive and has a low horizontal resolution (only a few lobes) and is not as good at identifying objects 3 in a complex scene); stereo vision (which requires two cameras and needs a wide baseline and rigid body, requires complex stereo image processing and has its distance accuracy limited by the camera separation); 2-D vision (which requires complex image processing and is not as accurate in measuring distances 54 and does not provide reliable distance information for variable sizes of detected vehicles 1); range imager (an imager technology that can measure object distance 54 by time of flight of the light pulses emitted by the light emitter, in addition to regular 2D image, and with the distance sensing being at the imager chip level, which is a complex semiconductor sensor fabrication and is a higher cost system).

Now referring to FIG. 19 and FIG. 20, there is provided an illustrative example of the digital imaging system 20 in operation for detecting a gesture, and for example for detecting a gesture of a hand 100. It will be appreciated that other gestures of other objects can also be detected and that the system is not limited to the hand example described herein. The digital imaging system 20 may be mounted as part of a vehicle component 101, such as side mirror assembly 102, a handle assembly 103, a vehicle applique 104, an interior rear view mirror 105, or as part of other vehicle components, provided at different positions on vehicle 1. For example, digital imaging system 20 may be provided on a vehicle bumper, and configured to be directed towards the ground. Digital imaging system 20 may be provided to detect a gesture for controlling a vehicle system based on the identified/recognized gesture, for example to control an unlocking of a vehicle lock, a window regulator system for opening/closing a vehicle window, controlling a powered door actuator unit for moving a door, controlling an audio system, as examples and without limitation. Illustratively, digital imaging system 20 is shown for detecting a hand gesture performing an approach and a change in orientation during the approach to the vehicle component 101 e.g. from a vertical extending hand position to a horizontally extending hand position. The digital imaging system 20 illustratively includes a plurality of main micro lenses, for example five lens provided only as part of a simplified illustrative example: $36_1$ to $36_5$ each having respectively a plurality of main focal lengths $48_1$ to $48_5$ selected to project the plurality of intermediary images $34_1$ to $34_5$ with the plurality of depths of field ($D_1$ to $D_5$) being spaced from one another (for example as shown in FIG. 19 every 5 or 10 centimeters, however different spacing between depth of fields may be provided for, and for example more closely spaced depths of field which may be advantageous for close proximity and fine gesture detection) for providing gesture detection within a near field of view, or close proximity, of the vehicle component 101. Each intermediary image $34_1$ to $34_5$ is focused within a common plane in front of the image sensor assembly 24 based on a distance 54 ($54_1$ to $54_5$) from the main lens 32, so that each intermediary image $34_1$ to $34_5$ within a depth of field $D_1$ to $D_5$ is in focus to provide proper image resolution for capture by the plurality of light sensors 30, as illustrated in FIG. 19 showing a subarray of light sensors 30 each capturing one of the intermediary image $34_1$ to $34_5$.

In accordance with an illustrative operation of the digital imaging system 20 shown in FIG. 19, the digital imaging system 20 is configured to measure the distance 54 from the hand 100 to the component 101 as the hand 100 approaches the lens 32. Illustratively as shown in FIG. 23, digital imaging system 20 is provided in a door handle 103 for detecting a gesture, such as a gesture of the hand 100, as an example. Other locations on the vehicle 1 are possible. As the hand 100 approaches the lens 32, or vehicle component 101 provided with the digital imaging system 20, the hand 100 will illustratively traverse multiple depths of fields, and as shown in FIG. 19 the hand will traverse the plurality of depths of field ($D_1$ to $D_5$), for example sequentially commencing with $D_1$ until $D_5$. As the hand 100 traverses the multiple depths of fields ($D_1$ to $D_5$), the hand 100 may also perform a gesture e.g. change in orientation, angle, cross-section etcetera, which may change the three-dimensional depth of the hand 100 as detected by the digital imaging system 20. The digital imaging system 20 may be configured to track the approaching hand 100, for example using object tracking techniques, to determine the gesture performed by the hand 100. For example the digital imaging system 20 may monitor simultaneously all the plurality of depths of field ($D_1$ to $D_5$) to determine if the object is present in a particular or multiple ones of the plurality of depths of field (D1 to D5) based on the resolution e.g. focus of the micro-images $37_1$-$37_5$ captured by the a plurality of light sensors 30 and as determined by the ECU 28. Other object tracking techniques performed by the ECU 28 may be provided for determining the depths of field ($D_1$ to $D_5$) in which the hand 100 is present. Once the particular depths of field ($D_1$ to $D_5$) the hand 100 is occupying is determined, the distance 101 from the component to the hand 100 is known within a resolution of the particular depth of field ($D_1$ to $D_5$), and by adding the distance 54 information based on the focal point of each intermediate microlens array 38 to the depth information ($DI_1$ to $DI_5$) of the three-dimensional image (micro-images 37) of the hand 100 captured within the particular depth of field ($D_1$ to $D_5$), an algorithm (e.g., of the control unit 28) can more accurately determine position information of the hand 100, and the gesture performed by the hand 100. For example, the algorithm can determine that a gesture has been performed by the hand 100 by determining that at an initial position e.g. within field of view $D_1$, the plenoptic lens system 22 determines that a captured image of the hand 100 generates a depth map 45 (illustratively shown in 2D) having a flat surface determined from a uniform distance (for example the uniform depth information $DI_1$ of captured image within depth of field D1 for the whole surface of the hand 100 as a result of its vertical orientation as shown in FIG. 20, which changes when the plenoptic lens system 22 determines that a captured image of the hand 100 in depth of field D5 generates a depth map 47 (illustratively shown in 2D) having a peaked surface P determined from a distance (for example the uniform depth information $DI_5$) of captured sub- or micro-image $37_5$ within depth of field D5 for a smaller detected surface of the hand 100 as a result of its horizontal orientation compared to the detected surface of the hand 100 when in depth of field D1 as shown in FIG. 21. For example the distance of the tips of the fingers of hand 100 shown in FIG. 21 may be calculated by adding the distance $54_5$ to the distance of the depth information $DI_5$ to the smallest distance representing the tip of the finger, when the distance 54 is calculated from proximate limit of depth of field D5, or the distance of the tips of the fingers of hand 100 shown in FIG. 21 may be calculated by subtracting the distance $54_5$ from the distance of the depth information $DI_5$ to the smallest distance representing the tip of the finger, when the distance 54 is calculated from center of depth of field D5. Further enhancing the gesture detection, timing information given by the video frames (a sequence of captured images) of the hand 100 traversing the multiple depths of fields ($D_1$ to $D_5$) enables the calculation of the hand 100 speeds which may further assist with gesture detection e.g. a change in detected surface of hand 100 as hand 100 traverses depth of field ($D_1$ to $D_5$) at a certain rate of change may indicate a correct activation gesture compared to a gesture stored in memory unit 26, 126, which may prompt ECU 28 to issue an activation command to control a vehicle system e.g. unlock a vehicle latch locking the door, actuate a powered actuator to move a vehicle door, as examples. The distance 54 and speed information can also feedback to a vision algorithm (e.g., of the control unit 28 or another controller) to help its object identification. While the digital imaging system 20 in operation has been illustrated to detect gesture of a hand 100 moving through multiple depths of fields ($D_1$ to $D_5$), other types of objects performing a gesture, such as a foot, an arm, leg, or other body part or motion, may be detected by the digital imaging system 20.

Now referring to FIG. 22, in addition to FIGS. 1 to 21, there is illustrated an exemplary method 1100 for detecting an object using a plenoptic camera including an image sensor assembly outputting image data comprising depth data of the object within a field of view, the method 1100 may be implemented by the control unit 28 programmed accordingly and including the steps of calculating at least one of position and distance information of the object within the field of view using the image data 1102, and providing the at least one of position and distance information of the object in the field of view to a vehicle system 1104. The method 1100 may further include the step of detecting at least one of a gesture and an obstacle based on the at least one of position and distance information. The method 1100 may further include the step of occluding background image information from the image data prior to calculating distance information. The method 1100 may further include the step of identifying and classifying areas of interest from the image data prior to calculating distance information. The method 1100 may further include the step of creating a three-dimensional depth map using the image data including the steps of creating the three-dimensional depth map using the image data associated with the areas of interest, ignoring the image data not associated with the areas of interest, and calculating at least one of position and distance information of the object within the field of view using three-dimensional depth map. The method 1100 may further include the step of providing position and distance information of the object in the areas of interest to the vehicle system, wherein the vehicle system includes at least one of an object detection system, a ranging system and a gesture recognition system, and a biometric identification system and a vehicle detection system. The plenoptic camera employed as part of the method 1100 may include a controllable birefringent lens, further comprising the step of controlling the birefringent lens to focus light from the plurality of depths of field. Plenoptic camera employed as part of the method 1100 may include an image sensor assembly and a plenoptic lens system including a main lens and an intermediate microlens array disposed between the main lens and the image sensor assembly in a spaced relationship with each of the main lens and the image sensor assembly, wherein the main lens is configured for focusing light from the field of view for a plurality of depths of field and projecting a plurality of intermediary images representative of a plurality of portions of the field of view at the plurality of depths of field using the main lens, wherein the intermediate microlens array is configured for focusing the plurality of intermediary images from the main lens onto the image sensor assembly using the intermediate microlens array, wherein the image sensor assembly is configured for capturing image data associated with the plurality of intermediary images representative of the plurality of portions of the field of view at the plurality of depths of field using the image sensor assembly.

Now referring to FIGS. 23 to 26, in addition to FIGS. 1 to 22, there is illustrated a vehicular vision system 2000 for a motor vehicle 1, the vehicular vision system 2000 including a plenoptic camera 2002, which may include an optical device with the plenoptic lens systems as described herein, but other types of plenoptic cameras or light field cameras may be employed, having a field of view for a plurality of depths of field of an exterior of the motor vehicle 1 and configured to output image data 2004 comprising depth information 2006 for each of the plurality of depths of field, a display device 2008 comprising a three dimensional video display 2010 disposed in an interior cabin 77 of the motor vehicle 1 and viewable by an occupant 2012 of the vehicle and configured to display on a video display screen, of the three dimensional video display device 2008, exterior video images derived from image data 2004, where the display device 2008 provides to the occupant an increase in information, for example due to a parallax effect, to the exterior video images as the occupant changes a viewing angle of the display device 2008 (e.g. moves his head 2014) to provide the occupant a depth perception of the exterior of the motor vehicle 1. Display device 2008 may be a volumetric display, a holographic display, an integral imaging display, or a compressive light field display as examples. Such additional depth perception may be provided by the display device 2008 displaying multiple fields of view allowing the user to recognize a change in relative motion between a foreground e.g. closer object, than a background object e.g. farther away when occupant 2012 changes his perspective e.g. moving his head 2014 when viewing the display device 2008. In other words, the display device 2010 allows the occupant 2012 such as the driver to gain depth perception by moving his head 2014, for example from a first position 2014' (solid outline) to a second position 2014" (dotted outline) to change the angle of viewing of a point, such as point of the displayed object 3' displayed on the display device 2008 to change the perception of the object from a first perception 3'" (solid outline) to a second perception 3'" (dotted outline) depending on the position of the head 2014 e.g. the head having moved from first position 2014' (solid outline) to the second position 2014". Such depth perception is not present when image data is displayed on a two dimensional display. Providing the driver 2012 with depth perception when viewing a display device 2008, and for example configured to receive image data 2004 using the plenoptic image systems 20, 120 described herein, can improve motor vehicle operation safety by allowing the driver 2012 to be able to judge distances when operating the vehicle 1 along with viewing the three dimensional display device 2008, for example when viewing video images on the display device 2008 of image data enhanced with 3 dimensional information as captured by a plenoptic camera 2002 positioned on a rear of the vehicle 1 during a backup or parking operation, for example when viewing video images on the display device 2008 of image data 2004 captured by the plenoptic camera 2002 positioned on a front of the vehicle 1 during a forwards or parking operation, for example when viewing video images on the display device 2008 of image data 2004 captured by the plenoptic camera 2002 positioned on a side rear view mirrors 167 of the vehicle 1 during driving or lane changes. FIG. 26 therefore illustrates a vehicular vision system 2000 for a motor vehicle 1, the vehicular vision system 2000 including a plenoptic camera 2002 electrically coupled to a display device 2008, for example directly (solid line), but a intervening controller 2009 (dashed outlined) may be provided electrically coupled to the plenoptic camera 2002 for controlling the plenoptic camera 2002 for providing image processing functions and coupled to the display device 2008, and the plenoptic camera 2002 configured to output image data 2004 comprising depth information 2006 for each of the plurality of depths of field captured by the plenoptic camera 2002, wherein the display device 2008 includes a three dimensional video display 2010.

Clearly, changes may be made to what is described and illustrated herein without, however, departing from the scope defined in the 2 accompanying claims. The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," "top", "bottom", and the like, may be used herein for ease of description to describe one element's or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated degrees or at other orientations) and the spatially relative descriptions used herein interpreted accordingly.

What is claimed is:

1. A digital imaging system for detecting an object as at least one of a gesture and an obstacle, comprising:
    a plenoptic lens system including a main lens configured to focus light from a field of view for a plurality of depths of field and project a plurality of intermediary images each representing one of the plurality of depths of field;
    an image sensor assembly disposed in a spaced relationship with the main lens and including a plurality of light sensors configured to output image data;
    the plenoptic lens system including an intermediate microlens array disposed between the main lens and the image sensor assembly in a spaced relationship with the main lens and the image sensor assembly and including a plurality of intermediate micro lenses adjacent to one another for focusing the plurality of intermediary images from the main lens onto the image sensor assembly, wherein each of the plurality of intermediate micro lenses projects the plurality of intermediary images onto the image sensor assembly from a different perspective than another of the plurality of intermediate micro lenses being adjacent thereto; and a control unit coupled to the image sensor assembly and configured to calculate distance information of the object in at least one of the plurality of depths of field using the image data, and detect the at least one of a gesture and the obstacle based on the distance information.

2. The digital imaging system as set forth in claim 1, wherein the control unit is further configured to create a three-dimensional depth map using the image data representing the plurality of intermediary images, calculate distance information of the plurality of surfaces of an object in the field of view from a view point using the three-dimensional depth map, and detect the at least one of a gesture and the obstacle based on the distance information.

3. The digital imaging system as set forth in claim 1, wherein the plurality of light sensors are grouped into a plurality of sensor sub-arrays, and wherein the plurality of intermediate micro lenses are grouped into a plurality of microlens sections each for focusing one of the plurality of intermediary images from the main lens onto one of the plurality of sensor sub-arrays, and wherein the main lens is configured to focus light from a field of view for a plurality of depths of field and project the plurality of intermediary images each representing one of the plurality of depths of field in front of one of the plurality of microlens sections.

4. The digital imaging system as set forth in claim 1, wherein the main lens comprises a plurality of main micro lenses adjacent to and abutting one another to simultaneously focus light from the plurality of depths of field and project the plurality of intermediary images, wherein the plurality of intermediary images are representative of a plurality of portions of the field of view at the plurality of depths of field.

5. The digital imaging system as set forth in claim 4, wherein the main lens is disposed a first distance from the intermediate microlens array and the first distance is greater than a main focal length of each of the plurality of main micro lenses.

6. The digital imaging system as set forth in claim 5, wherein the intermediate microlens array is disposed a second distance from the image sensor assembly and the second distance is equal to an intermediate focal length of each of the plurality of intermediate micro lenses.

7. The digital imaging system as set forth in claim 4, wherein the plurality of main micro lenses have a plurality of main focal lengths selected to project the plurality of intermediary images with the plurality of depths of field being equally spaced from one another.

8. The digital imaging system as set forth in claim 4, wherein the plurality of main micro lenses have a plurality of main focal lengths selected to project the plurality of intermediary images with the plurality of depths of field being selected as a function of the distance from the main lens, wherein the plurality of depths of field are smaller as distance from the main lens increases or the plurality of depths of field are larger as distance from the main lens increases.

9. The digital imaging system as set forth in claim 1, wherein the main lens comprises a controllable birefringent lens to focus light from the plurality of depths of field and project the plurality of intermediary images sequentially, wherein the plurality of intermediary images are representative of the field of view at each of the plurality of depths of field, wherein the control unit is configured to control the controllable birefringent lens to focus light from each of the plurality of depths of field and project the plurality of intermediary images in sequence over a predetermined period of time.

10. The digital imaging system as set forth in claim 1, wherein the control unit is further configured to provide at least one of position and the distance information of the object to a vehicle system.

11. The digital imaging system as set forth in claim 10, wherein the vehicle system is selected from a group consisting of a display device, an obstacle detection system, a warning system, a gesture detection system, or an advanced driver assistance system.

12. A method for detecting an object using a plenoptic camera comprising an image sensor assembly outputting image data comprising depth data of the object within a field of view, the method comprising the steps of:

calculating at least one of position and distance information of the object within the field of view using the image data; and providing the at least one of position and distance information of the object in the field of view to a vehicle system;

wherein the plenoptic camera includes an image sensor assembly and a plenoptic lens system including a main lens and an intermediate microlens array disposed between the main lens and the image sensor assembly in a spaced relationship with each of the main lens and the image sensor assembly;

wherein the main lens is configured for focusing light from the field of view for a plurality of depths of field and projecting a plurality of intermediary images representative of a plurality of portions of the field of view at the plurality of depths of field using the main lens;

wherein the intermediate microlens array is configured for focusing the plurality of intermediary images from the main lens onto the image sensor assembly using the intermediate microlens array;

wherein the image sensor assembly is configured for capturing image data associated with the plurality of intermediary images representative of the plurality of portions of the field of view at the plurality of depths of field using the image sensor assembly.

13. The method as set forth in claim 12, further including the step of detecting at least one of a gesture and an obstacle based on the at least one of position and distance information.

14. The method as set forth in claim 12, further including the step of occluding background image information from the image data prior to calculating distance information.

15. The method as set forth in claim 12, further including the step of identifying and classifying areas of interest from the image data prior to calculating distance information.

16. The method as set forth in claim 15, further comprising the step of creating a three-dimensional depth map using the image data including the steps of:

creating the three-dimensional depth map using the image data associated with the areas of interest;

ignoring the image data not associated with the areas of interest; and calculating at least one of position and distance information of the object within the field of view using three-dimensional depth map.

17. The method as set forth in claim 16, further including the step of providing position and distance information of the object in the areas of interest to the vehicle system, wherein the vehicle system includes at least one of an object detection system, a ranging system and a gesture recognition system, and a biometric identification system and a vehicle detection system.

18. The method as set forth in claim 12, wherein the plenoptic camera includes a controllable birefringent lens, further comprising the step of controlling the birefringent lens to focus light from the plurality of depths of field.

19. An optical device for detecting at least one of a gesture and an obstacle, comprising:
   a plenoptic lens system including a main lens configured to focus light from a field of view for a plurality of depths of field and project a plurality of intermediary images each representing one of the depths of field; and
   an image sensor assembly disposed in a spaced relationship with the main lens and including a plurality of light sensors;
   the plenoptic lens system including an intermediate microlens array disposed between the main lens and the image sensor assembly in a spaced relationship with each of the main lens and the image sensor assembly and including a plurality of intermediate micro lenses adjacent to one another for focusing the plurality of intermediary images from the main lens onto the image sensor assembly, wherein each of the plurality of intermediate micro lenses projects the plurality of intermediary images onto the image sensor assembly from a different perspective than another of the plurality of intermediate micro lenses being adjacent thereto.

* * * * *